US012362258B2

United States Patent
Lin et al.

(10) Patent No.: US 12,362,258 B2
(45) Date of Patent: Jul. 15, 2025

(54) THERMAL MODULE FOR A SEMICONDUCTOR PACKAGE AND METHODS OF FORMING THE SAME

(71) Applicant: Taiwan Semiconductor Manufacturing Company Limited, Hsinchu (TW)

(72) Inventors: Po-Yao Lin, Zhudong Township (TW); Sheng-Liang Kuo, Hsinchu (TW); Yu-Sheng Lin, Zhubei (TW); Kathy Yan, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 211 days.

(21) Appl. No.: 17/885,033

(22) Filed: Aug. 10, 2022

(65) Prior Publication Data

US 2024/0055321 A1 Feb. 15, 2024

(51) Int. Cl.
*H01L 23/427* (2006.01)
*H01L 23/473* (2006.01)

(52) U.S. Cl.
CPC .......... *H01L 23/427* (2013.01); *H01L 23/473* (2013.01)

(58) Field of Classification Search
CPC . H01L 23/427; H01L 23/473; H05K 7/20336; H05K 7/2029; H05K 7/20309; H05K 7/2039
See application file for complete search history.

(56) References Cited

U.S. PATENT DOCUMENTS

| | | | |
|---|---|---|---|
| 6,840,311 B2 * | 1/2005 | Ghosh | F28D 15/0233 165/104.33 |
| 9,390,994 B2 * | 7/2016 | Guenin | H01L 23/3672 |
| 10,220,725 B2 * | 3/2019 | Rush | H05K 7/20936 |
| 10,619,842 B1 * | 4/2020 | Wang | F21V 29/89 |
| 11,109,515 B1 * | 8/2021 | Nagarajan | H04Q 11/0005 |
| 2016/0014931 A1 * | 1/2016 | Hamakawa | H05K 7/20336 165/104.26 |
| 2020/0152546 A1 * | 5/2020 | Refai-Ahmed | H01L 23/481 |

* cited by examiner

Primary Examiner — Jayprakash N Gandhi
Assistant Examiner — Matthew Sinclair Muir
(74) Attorney, Agent, or Firm — The Marbury Law Group, PLLC

(57) ABSTRACT

A thermal module may include a cold plate including a cold plate base having a cold plate base protruding portion, and a cold plate cover on the cold plate base, and a heat pipe between the cold plate base and the cold plate cover, and including an upper heat pipe portion and a lower heat pipe portion in the cold plate base protruding portion.

20 Claims, 18 Drawing Sheets

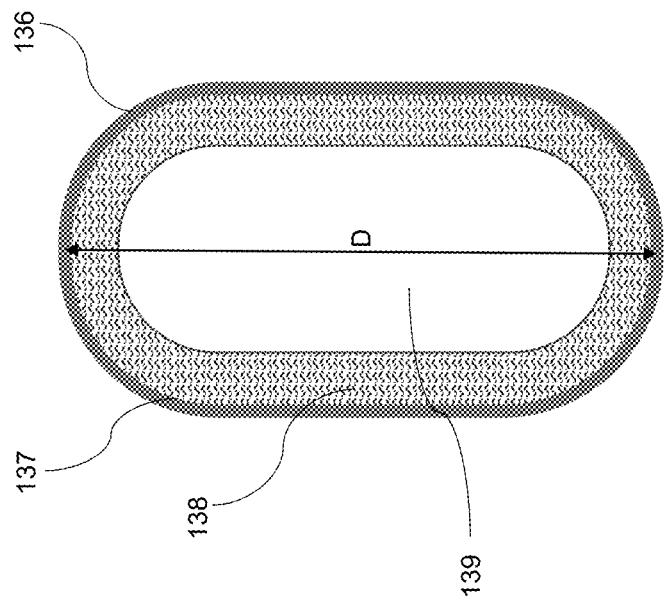

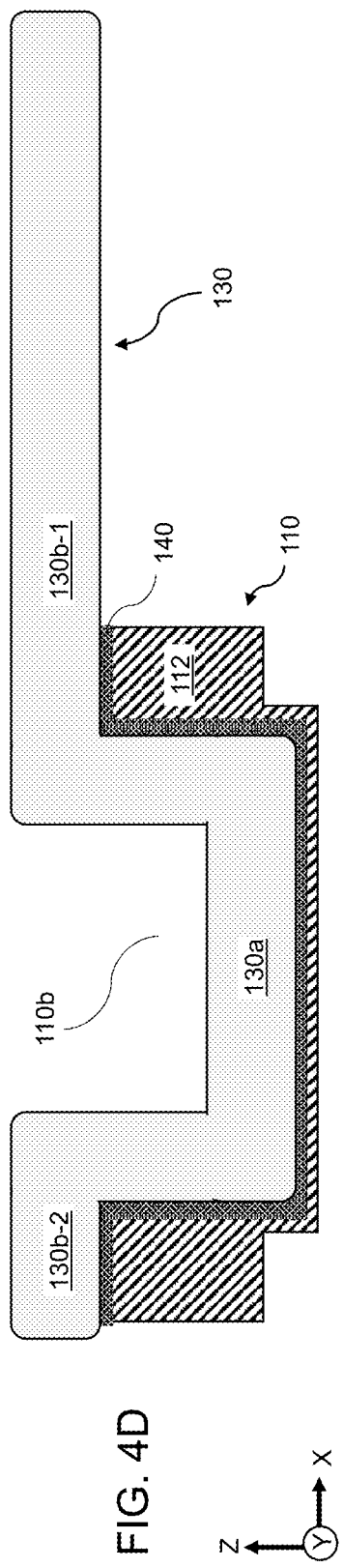
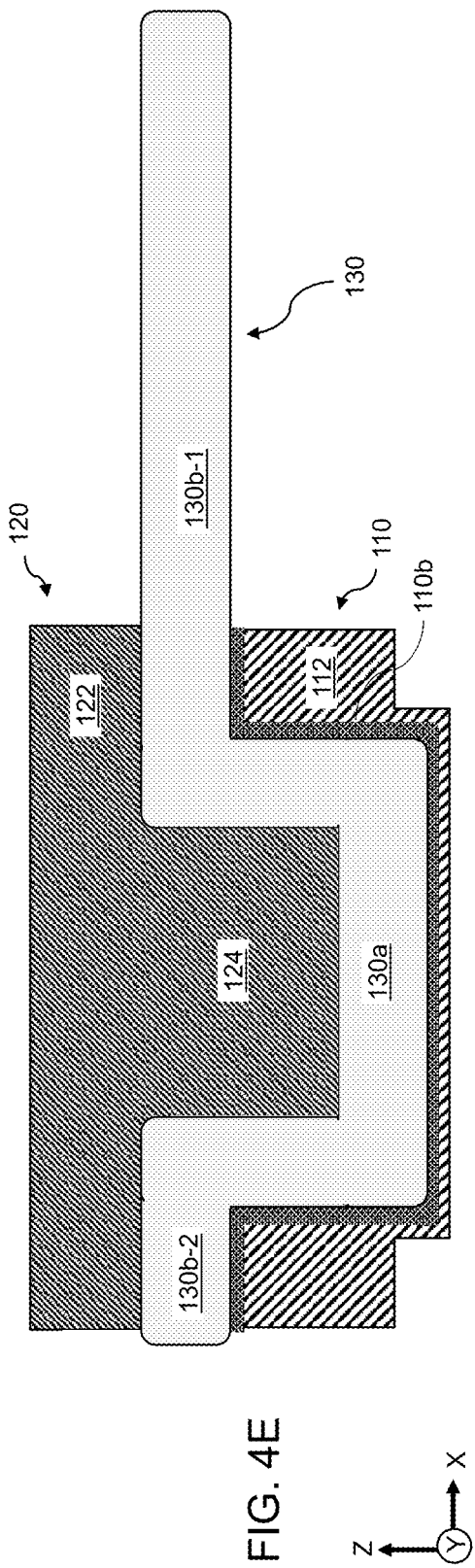
FIG. 4D
FIG. 4E

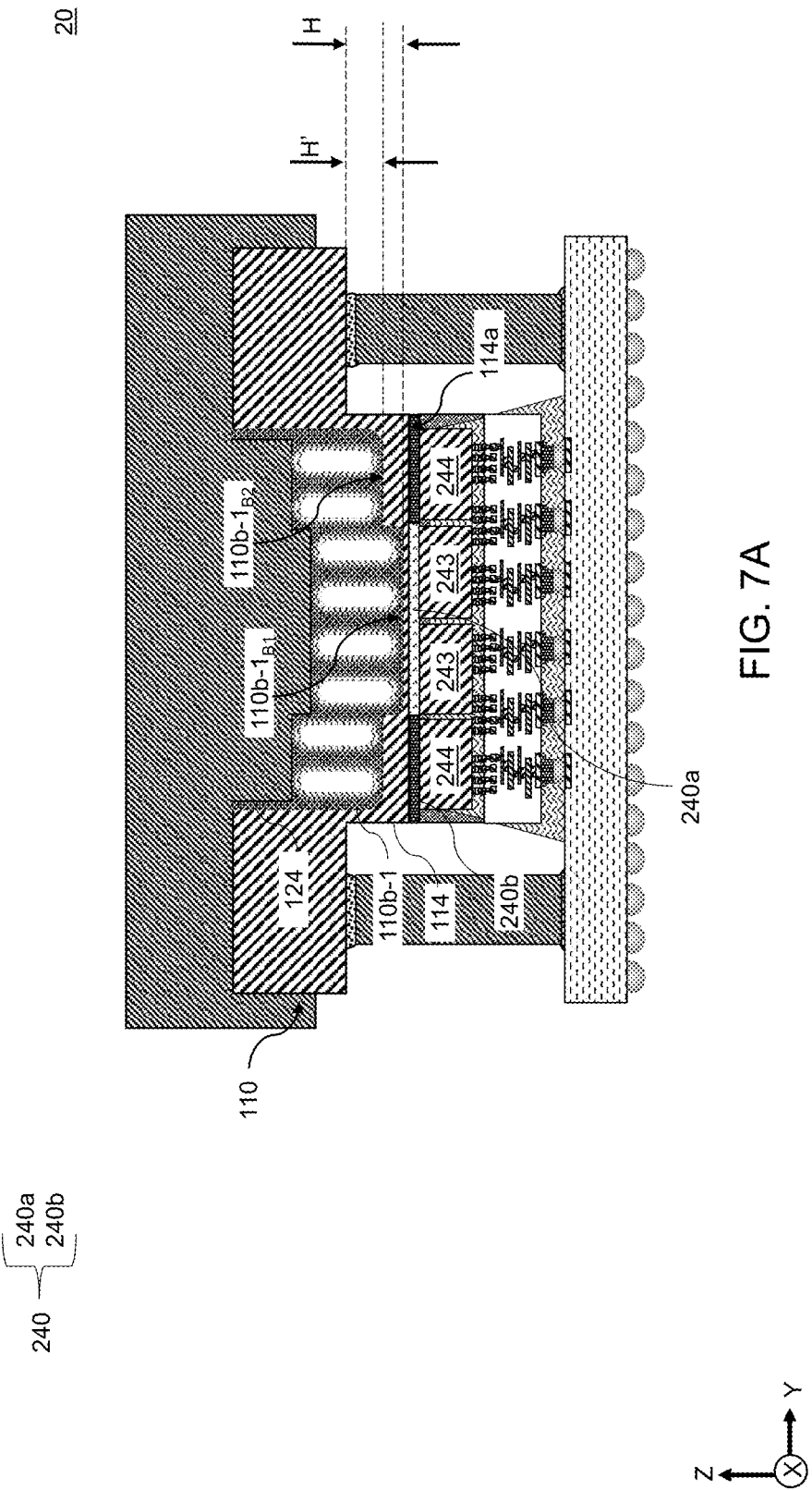

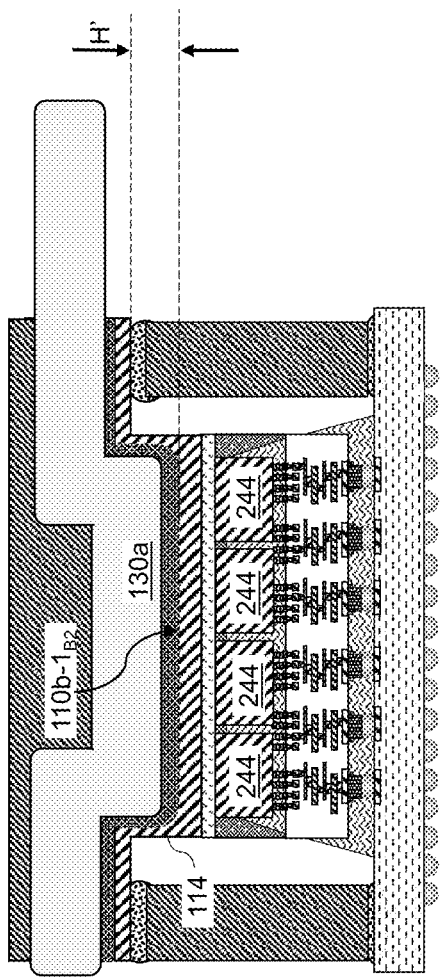
FIG. 7B
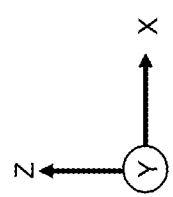
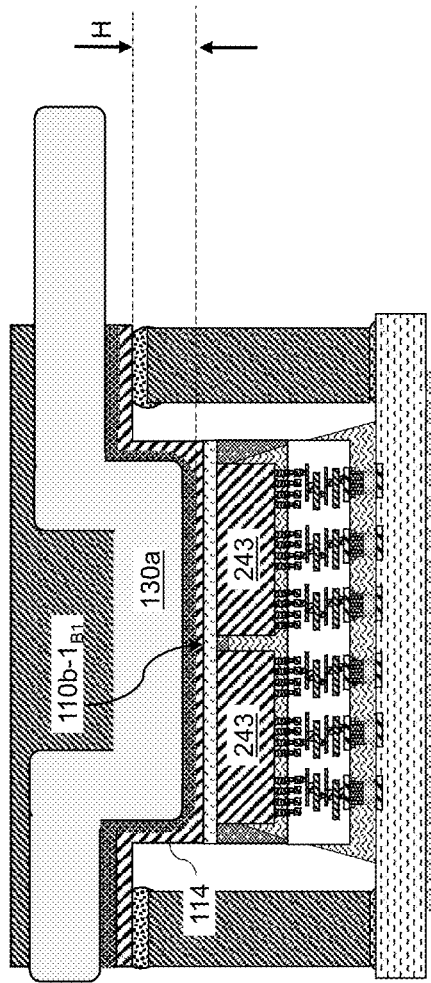
FIG. 7C
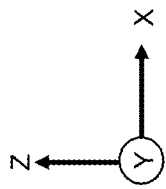

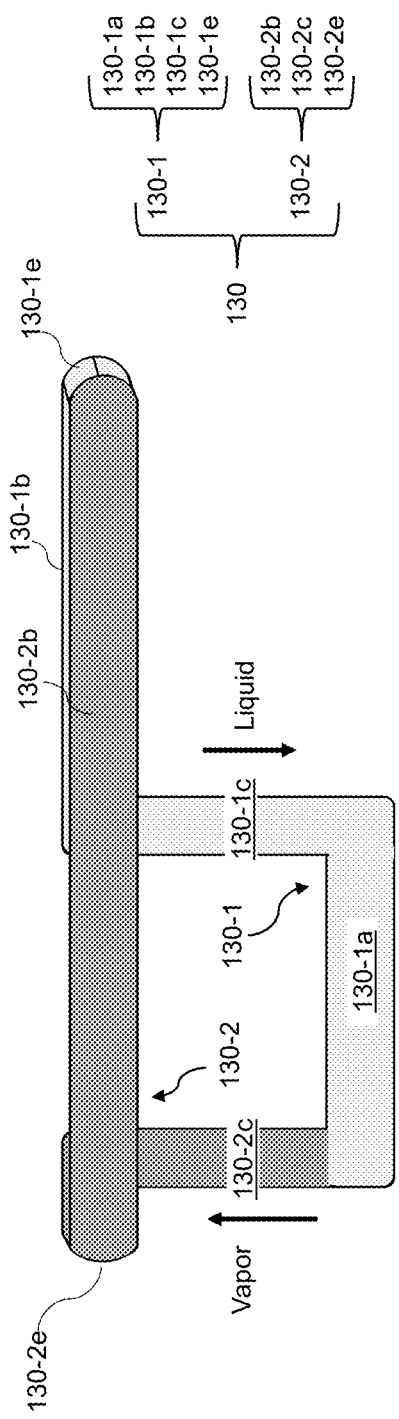
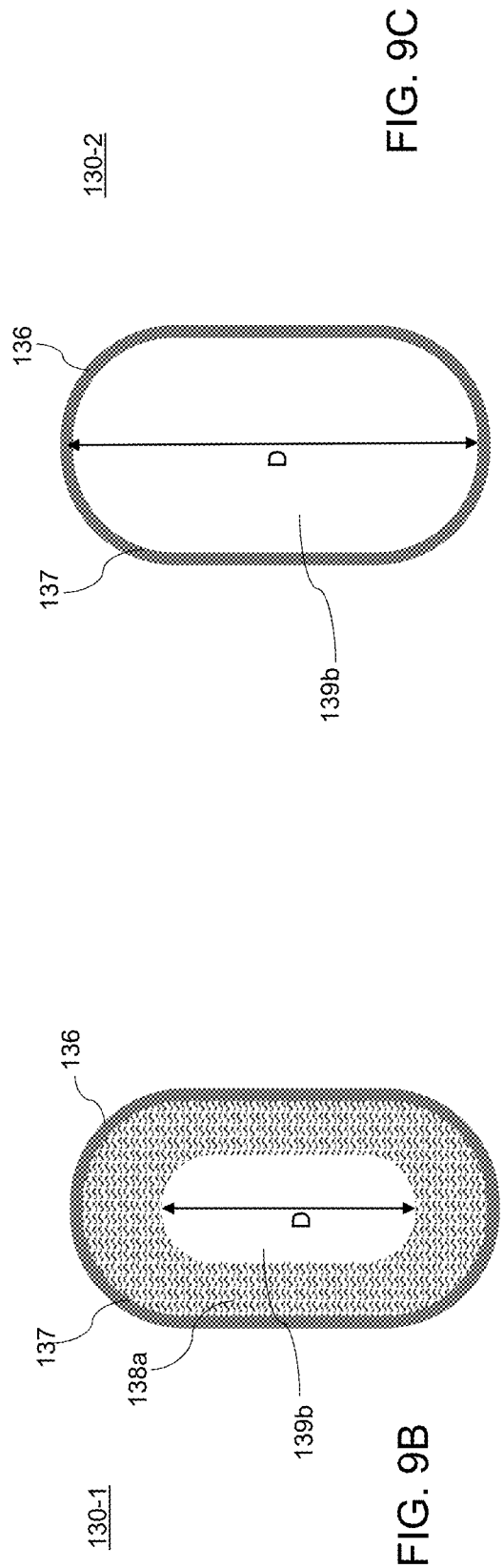
FIG. 9A
FIG. 9B
FIG. 9C

THERMAL MODULE FOR A SEMICONDUCTOR PACKAGE AND METHODS OF FORMING THE SAME

BACKGROUND

A semiconductor package may include one or more semiconductor devices (e.g., semiconductor dies, interposer modules, etc.) mounted on a substrate. Operation of the semiconductor devices may generate heat that can cause a degradation in package life and operating efficiency. Therefore, the semiconductor package may include a mechanism for removing and/or dissipating the heat generated by operation of the semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1C is a cross-sectional view of a heat pipe according to one or more embodiments.

FIG. 4D illustrates an intermediate structure including the heat pipes on the cold plate base, according to one or more embodiments.

FIG. 4E illustrates an intermediate structure including the cold plate cover on the cold plate base, according to one or more embodiments.

FIG. 7A is a vertical cross-sectional view of an alternative design of the semiconductor device according to one or more embodiments.

FIG. 7B is another vertical cross-sectional view of the alternative design of the semiconductor device according to one or more embodiments.

FIG. 7C is another vertical cross-sectional view of the alternative design of the semiconductor device according to one or more embodiments.

FIG. 9A is a perspective view of the alternative heat pipe design according to one or more embodiments.

FIG. 9B is a cross-sectional view of the delivery heat pipe section according to one or more embodiments.

FIG. 9C is a cross-sectional view of the return heat pipe section according to one or more embodiments.

DETAILED DESCRIPTION

Figure 1A:
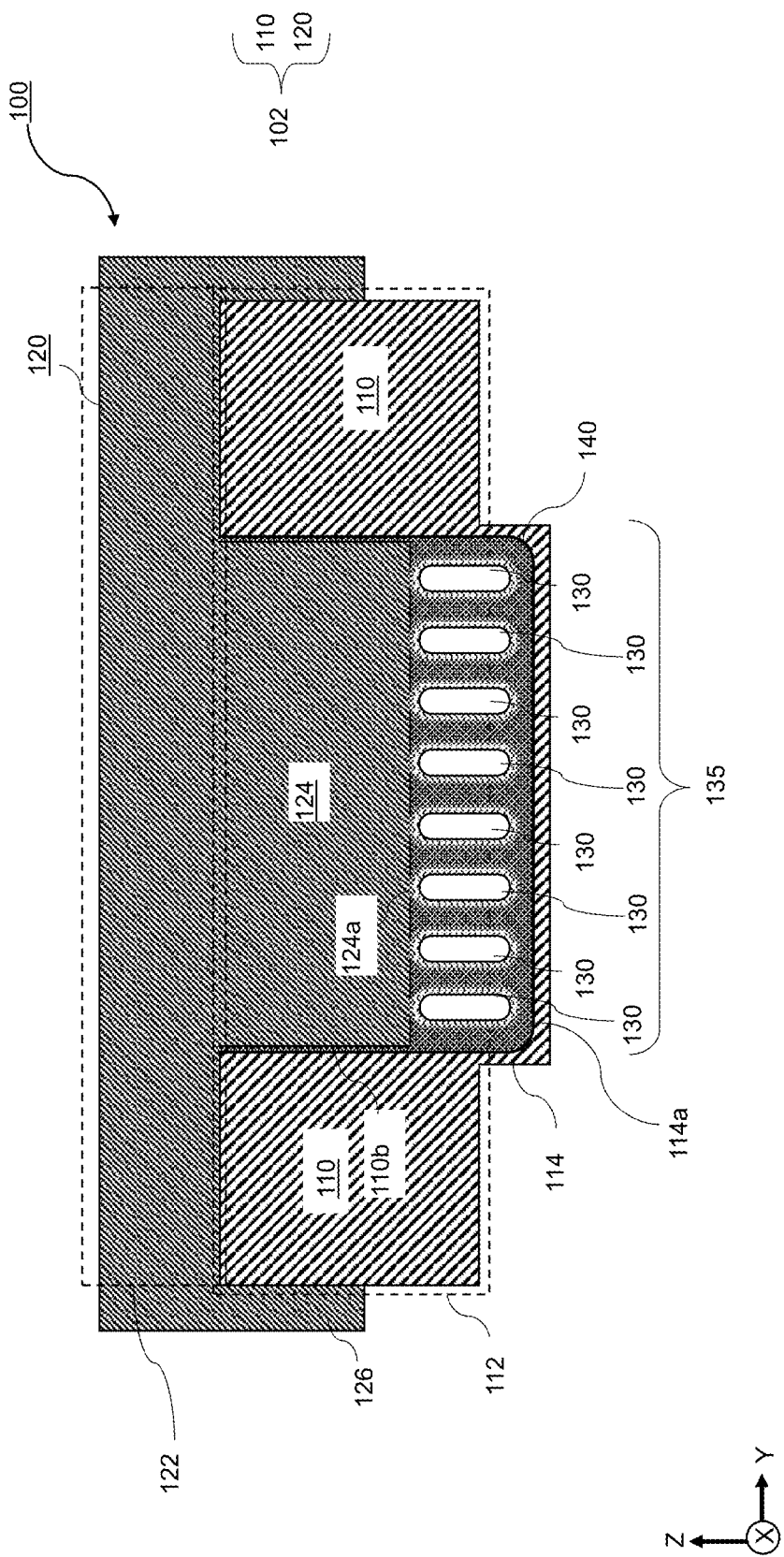
FIG. 1A is a vertical cross-sectional view of a thermal module according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

A mechanism for removing heat in a semiconductor package (e.g., semiconductor structure; high power package) may include a thermal module (e.g., heat pipe thermal module) for cooling the semiconductor package. The thermal module may comprise a cold plate positioned on an interposer module of the semiconductor package. The cold plate may include, for example, a cold plate base (e.g., a copper plate) and a cold plate cover on the cold plate base. The thermal module may further comprise, for example, one or more heat pipes on the cold plate base.

The thermal module may include a remote type heat-pipe heat sink and be part of a remote-type heat-pipe heat sink design. In at least one embodiment, the heat generated a high-performance computing (HPC) die in the semiconductor package may be dissipated through the cold plate base.

The heat pipes attached to the cold plate base may transfer the heat removed from the HPC die to the heat sink. A fan module may provide airflow for removing the heat from the heat sink.

The thermal module may be used, for example, to cool a heterogeneous fan-out package (e.g., high power package) having a stiffener ring structure. In such an embodiment, the cold plate base may include a protruding portion (e.g., protrusion, pedestal base, etc.) on the interposer module (e.g., a chip on wafer (CoW) die) for cooling. However, in such an embodiment, the heat pipes may be unable to come into close proximity to the interposer module, resulting in poor thermal performance. Thus, the cooling capability of such as design may be unable to meet a cooling requirement of a high-power package (e.g., ultra-high-power package).

One or more embodiments of the present disclosure may include a thermal module for a semiconductor package. The thermal module may be used, for example, on a high-performance computing (HPC) fan-out package. The thermal module may include a cavity design in the protruding portion of the cold plate base. In addition, one or more of the heat pipes may be bent with U-shape and soldered in the cavity. The thermal module may help to improve a thermal performance for the semiconductor package (e.g., ring-type semiconductor package). Thus, the thermal module may provide an innovative design for heterogeneous integration HPC packages.

Figure 1B:
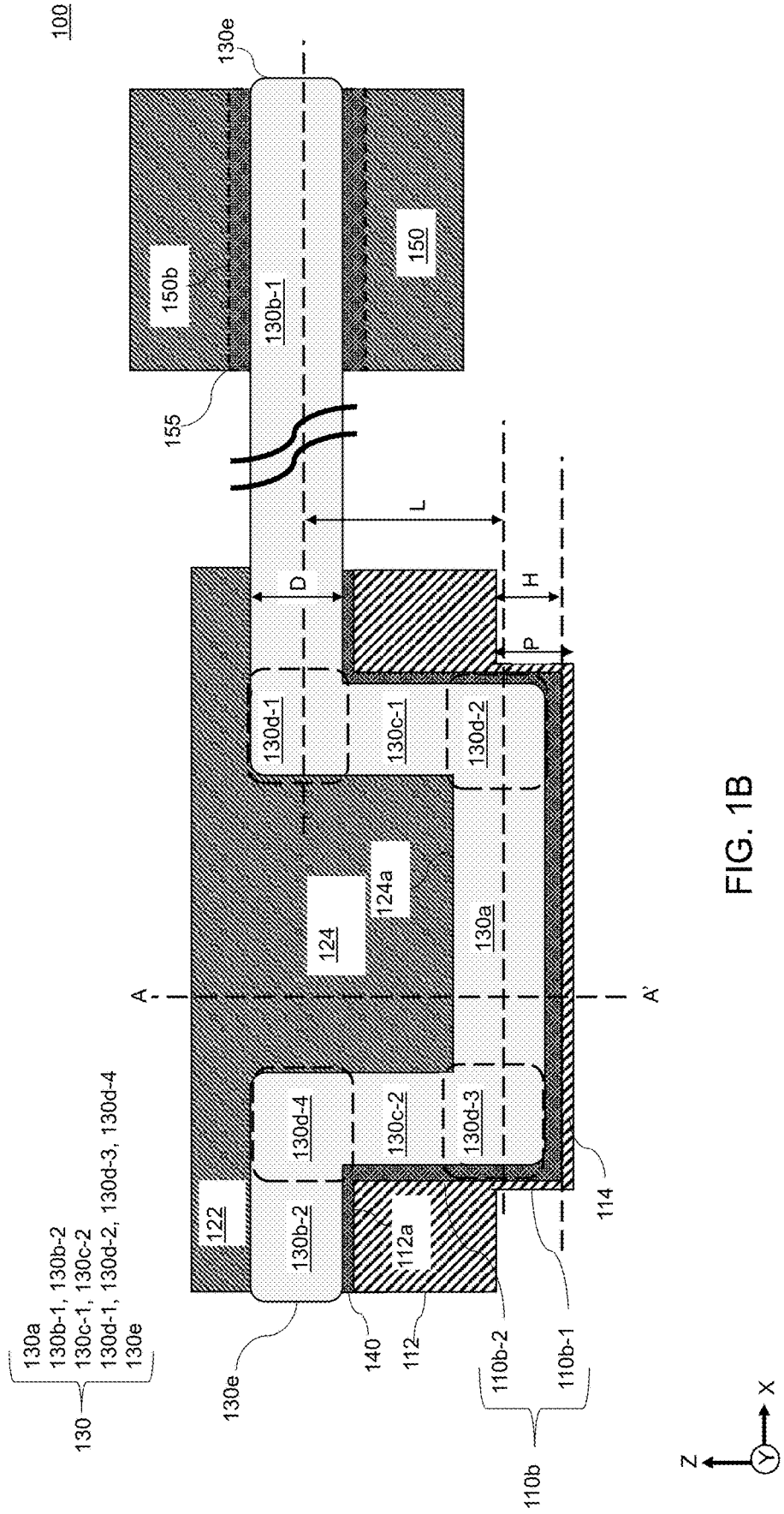
FIG. 1B is another vertical cross-sectional view of the thermal module according to one or more embodiments.

FIGS. 1A-1B provide different views of a thermal module 100 according to one or more embodiments. In particular, FIG. 1A is a vertical cross-sectional view in the yz-plane of a thermal module 100 according to one or more embodiments. FIG. 1A is a vertical cross-sectional view along line AA' in FIG. 1B. The thermal module 100 may include a cold plate 102 that includes a cold plate base 110 and a cold plate cover 120. The cold plate cover 120 may cover at least a portion of the cold plate base 110. The cold plate base 110 and the cold plate cover 120 may include a thermally conductive material such as a thermally conductive metal. In particular, the cold plate base 110 and cold plate cover 120 may include one or more thermally conductive metals or metal alloys including, for example, aluminum and copper. Other thermally conductive metals or metal alloys are within the contemplated scope of disclosure. The cold plate base 110 and cold plate cover 120 may be formed of the same material or different material.

The cold plate base 110 may include a cold plate base planar portion 112 that may contact the cold plate cover 120. As illustrated in FIG. 1A, the cold plate base planar portion 112 may have a width (e.g., in the y-direction) that is less than a width of the cold plate cover 120. The cold plate base 110 may also include a cold plate base protruding portion 114 that may protrude from the cold plate base planar portion 112. The cold plate base protruding portion 114 may have a width in the y-direction that is less than the width of the cold plate base planar portion 112 in the y-direction. In at least one embodiment, a center of the cold plate base protruding portion 114 may be substantially aligned with a center of the cold plate base planar portion 112 in the z-direction. The cold plate base protruding portion 114 may have a contact surface 114a that may be designed to contact a surface of a semiconductor package for the purpose of cooling the semiconductor package.

The cold plate cover 120 may include a cold plate cover planar portion 122 that may cover the cold plate base 110. The cold plate cover 120 may also include a cold plate cover protruding portion 124 that may protrude from the cold plate cover planar portion 122. In particular, the cold plate cover protruding portion 124 may protrude into a cold plate base cavity 110b in the cold plate base 110. The cold plate cover protruding portion 124 may have a width in the y-direction that is substantially the same (e.g., slightly less) than a width of the cold plate base cavity 110b. In at least one embodiment, the width of the cold plate base cavity 110b may be at least 0.5 mm greater than a width of the cold plate cover protruding portion 124.

The cold plate cover 120 may also include a cold plate cover side portion 126 that may be formed around at least a portion of a perimeter of the cold plate cover planar portion 122. The cold plate cover side portion 126 may also be located outside an outer wall of the cold plate base 110. Thus, in a vertical cross-sectional view, the cold plate base 110 and cold plate cover 120 may have an interlocking configuration in which the cold plate base planar portion 112 may be located between the cold plate cover protruding portion 124 and the cold plate cover side portion 126. The cold plate cover 120 may be fixed to the cold plate base 110 by one or more fastening members such as a screw. In particular, the cold plate cover planar portion 122 may connected to the cold plate base planar portion 112 by one or more screws (not shown).

The thermal module 100 may also include a heat pipe unit 135 including one or more heat pipes 130 located in the cold plate base cavity 110b. The cold plate cover protruding portion 124 may include a bottom surface 124a that contacts an upper surface of the heat pipes 130. The heat pipes 130 may include an inner opening containing a heat exchange fluid (e.g., a coolant fluid such as water) that may be used to cool the semiconductor package on which the thermal module 100 is mounted.

It should be noted that the terms "cold", "cool", "warm" or "hot" as used herein in relation to the heat exchange fluid (e.g., water) are not intended to mean that the heat exchange fluid has any certain temperature or range of temperatures. Instead, the terms "cold" and "cool" may simply be used to describe the heat exchange fluid that enters the cold plate base cavity 110b, and the terms "warm" or "hot" may simply be used to describe the heat exchange fluid that exits the cold plate base cavity 110b.

FIG. 1A provides an axial view of the heat pipes 130. As illustrated in FIG. 1A, an axis of the heat pipes 130 in FIG. 1A may extend in the x-direction (i.e., into the page). As further illustrated in FIG. 1A, the heat pipes 130 may have an oval cross-section with a longitudinal direction in the z-direction. However, the heat pipes 130 may have a circular cross-section or other cross-sectional shapes. The heat pipes 130 may be formed of a thermally conductive material such as a thermally conductive metal including, for example, aluminum, copper, etc. The material of the heat pipes 130 may also be relatively malleable in order to accommodate bending of the heat pipes 130. Further, although eight (8) heat pipes 130 of similar shapes and sizes (e.g., diameters or cross-sectional sizes) are illustrated in FIG. 1A, any number of heat pipes 130 having different shapes and sizes may be included in the thermal module 100. In at least one embodiment, a spacing between the heat pipes 130 may be substantially the same.

The heat pipes 130 may be fixed in the cold plate base 110 by a solder layer 140. The solder layer 140 may be formed on the bottom of the cold plate base cavity 110b and on a sidewall of the cold plate base cavity 110b for fixing the heat pipes 130 in the cold plate base cavity 110b. The solder layer 140 may be formed around at least a portion of each of the heat pipes 130. In particular, the solder layer 140 may be formed around a bottom and sides of the heat pipes 130. The solder layer 140 may also be formed between the heat pipes 130. The solder layer 140 may include, for example, a metal alloy including tin, silver, copper, nickel, antimony, etc. (e.g., a tin-silver-copper alloy).

As illustrated in FIG. 1A, at least a portion of the heat pipes 130 may be located in the cold plate base protruding portion 114. In particular, only a thin portion of the cold plate base protruding portion 114 (in addition to the solder layer 140) may separate the heat pipes 130 from the contact surface 114a. In at least one embodiment, a thickness of the cold plate base protruding portion 114 at a bottom of the cold plate base cavity 110b may be less than about 0.5 mm. This may allow the thermal module 100 to provide more effective cooling than a typical thermal module in which the heat pipes are not located in a cold plate base protruding portion.

FIG. 1B is another vertical cross-sectional view in the xz-plane of the thermal module 100 according to one or more embodiments. As illustrated in FIG. 1B, the cold plate base cavity 110b may include a cold plate base protruding portion cavity 110b-1 in the cold plate base protruding portion 114, and a cold plate base planar portion cavity 110b-2 in the cold plate base planar portion 112. A shape of the heat pipes 130 may substantially conform to a shape of the cold plate base protruding portion cavity 110b-1 and the cold plate base planar portion cavity 110b-2. In at least one embodiment, the heat pipes 130 may include a U-shape in the cold plate base cavity 110b. In at least one embodiment, a ratio (H/P) of a depth (H) of the cold plate base protruding portion cavity 110b-1 to a length P of the cold plate base protruding portion 114 is less than or equal to 0.5 (i.e., H/P≤0.5).

The heat pipes 130 may extend longitudinally along a bottom of the cold plate base protruding portion cavity 110b-1, along a sidewall of the cold plate base protruding portion cavity 110b-1 and along a sidewall of the cold plate base planar portion cavity 110b-2. The heat pipes 130 may also extend outside the cold plate base cavity 110b, along an upper surface 112a of the cold plate base planar portion 112. The solder layer 140 may also be located between the heat pipes 130 and the upper surface 112a so as to fix the heat pipes 130 to the upper surface 112a.

As also illustrated in FIG. 1B, the thermal module 100 may also include a heat sink 150 thermally connected to the heat pipes 130. The heat sink 150 may include a heat sink opening 150b and one or more of the heat pipes 130 may located in the heat sink opening 150b. The heat pipes 130 may be fixed to a surface of the heat sink opening 150b by a solder layer 155. The solder layer 155 may be similar to the solder layer 140. The heat sink 150 may include a fin stack including plurality of fins (e.g., thermally conductive metal plates; not shown) that may be in close proximity to the heat pipes 130. The fins may increase the surface area of the heat sink 150 and therefore, assist in the dissipation of heat transferred to the heat sink 150, and increase a cooling of the heat pipes 130.

The heat sink 150 may be made from a material that is similar to the material of the cold plate 102. Thus, the heat sink 150 may include a thermally conductive material such as a thermally conductive metal. In particular, the heat sink 150 may include one or more thermally conductive metals or metal alloys including, for example, aluminum and copper. Other suitable thermally conductive metals or metal alloys for use as the heat sink 150 may also be within the contemplated scope of disclosure.

As further illustrated in FIGS. 1A and 1B, the heat pipes 130 may include a lower heat pipe portion 130a. At least a portion of the lower heat pipe portion 130a may located on a bottom of the cold plate base protruding portion cavity 110b-1 so as to be in close proximity to a semiconductor package to be cooled. The cold plate cover protruding portion 124 may be formed on (e.g., contact an upper surface of) the lower heat pipe portion 130a.

The heat pipe 130 may further include a first upper heat pipe portion 130b-1 that may be connected, for example, to the heat sink 150. The wavy lines on the first upper heat pipe portion 130b-1 in FIG. 1B are used to indicate that a length of the first upper heat pipe portion 130b-1 is not necessarily to scale, but may be significantly greater than the length depicted in FIG. 1B. The heat pipe 130 may also include a second upper heat pipe portion 130b-2 that may be located opposite the first upper heat pipe portion 130b-1. The first upper heat pipe portion 130b-1 and the second upper heat pipe portion 130b-2 may be located outside the cold plate base cavity 110b. The first upper heat pipe portion 130b-1 and the second upper heat pipe portion 130b-2 may also be located at a substantially same height in the z-direction. That is, an axis of the first upper heat pipe portion 130b-1 may be substantially the same as an axis of the second upper heat pipe portion 130b-2. In addition, the axis of the first upper heat pipe portion 130b-1 and the axis of the second upper heat pipe portion 130b-2 may be substantially parallel to an axis of the lower heat pipe portion 130a.

The heat pipe 130 may also include a first side heat pipe portion 130c-1 connecting the first upper heat pipe portion 130b-1 to the lower heat pipe portion 130a, and a second side heat pipe portion 130c-2 connecting the second upper heat pipe portion 130b-2 to the lower heat pipe portion 130a. The first side heat pipe portion 130c-1 and the second side heat pipe portion 130c-2 may be formed along a sidewall of the cold plate base cavity 110b. An axis of the first side heat pipe portion 130c-1 may be substantially parallel to an axis of the second side heat pipe portion 130c-2. In addition, the axis of the first side heat pipe portion 130c-1 and the axis of the second side heat pipe portion 130c-2 may be substantially perpendicular to the axis of the first upper heat pipe portion 130b-1, the axis of the second upper heat pipe portion 130b-2 and the axis of the lower heat pipe portion 130a. The heat pipe 130 may also include a closed end portion 130e at an end of the first upper heat pipe portion 130b-1 and at an end of the second upper heat pipe portion 130b-2.

The heat pipe 130 may also include a first bent heat pipe portion 130d-1 connecting the first upper heat pipe portion 130b-1 to the first side heat pipe portion 130c-1. The heat pipe 130 may also include a second bent heat pipe portion 130d-2 connecting the first side heat pipe portion 130c-1 to the lower heat pipe portion 130a. The heat pipe 130 may also include a third bent heat pipe portion 130d-3 connecting the lower heat pipe portion 130a to the second side heat pipe portion 130c-2. The heat pipe 130 may also include a fourth bent heat pipe portion 130d-4 connecting the second side heat pipe portion 130c-2 to the second upper heat pipe portion 130b-2. Each of the first bent heat pipe portion 130d-1, second bent heat pipe portion 130d-2, third bent heat pipe portion 130d-3 and fourth bent heat pipe portion 130d-4 may include a bend angle that is in a range from about 90° to 100°. In at least one embodiment, the bend angle may be substantially 90° (e.g., a 90° bend angle). Although, other angles may be used in other embodiments.

The heat pipes 130 may include a substantially uniform heat pipe diameter D. Thus, for example, each of the lower heat pipe portion 130a, first upper heat pipe portion 130b-1, second upper heat pipe portion 130b-2, first side heat pipe portion 130c-1 and second side heat pipe portion 130c-2 may have substantially the same heat pipe diameter D. In at least one embodiment, the various portions of the heat pipe 130 may have different diameters. As further illustrated in FIG. 1B, a heat pipe bending length L (e.g., a distance in the z-direction between a centerline axis of the first upper heat pipe portion 130b-1 (and second upper heat pipe portion 130b-2) and a centerline axis of the lower heat pipe portion 130a) may be greater than or equal to one half of a heat pipe diameter D of the heat pipe 130 (L≥D/2).

FIG. 1C is a cross-sectional view of a heat pipe 130 according to one or more embodiments. As illustrated in FIG. 1C, the heat pipe 130 may include a heat pipe wall 136 that may include the metal material (e.g., copper, aluminum, etc.). The diameter D of the heat pipe 130 (e.g., inner diameter of the heat pipe wall 136) may be in a range from about 1 mm to about 12 mm. While the heat pipe 130 in FIG. 1C is illustrated to have an oval cross section, the heat pipe 130 may have a circular cross section or other closed shape cross section. In embodiments in which the cross sectional shape of the heat pipe 130 is non-circular cross-section, the term "diameter" may refer to the largest cross-sectional dimension of the pipe (e.g., see FIGS. 1C, 9B and 9C). The heat pipe 130 may further include a wick structure 138 on an inner surface 137 of the heat pipe wall 136. The wick structure 138 may include, for example, one or more of a screen structure, sintered structure (e.g., sintered powder) or grooved structure. A central portion of the heat pipe 130 may include a center vacuum core region 139.

The heat pipe 130 may contain the liquid (e.g., water) that is held within the wick structure 138 around the inner periphery of the heat pipe along inner surface 137. The heat pipe may and operate to cool the semiconductor package on which the thermal module 100 may be mounted, by a cycle (e.g., a continuous cycle) of evaporating the liquid (e.g., phase change from liquid to vapor) contained in the wick structure 138 such that the water vapor is transported in the center vacuum core region 139 back to portion of the heat pipe 130 that is thermally coupled to the heat sink 150. In the portion of the heat pipe 130 (i.e., 130e) that is thermally coupled to the heat sink 150, the water vapor may be condensed back to a liquid (e.g., (e.g., phase change from vapor to liquid). The lower heat pipe portion 130a may function as an evaporator in which the liquid may be evaporated into a vapor. The first upper heat pipe portion 130b-1 within and/or near the heat sink 150 may function as a condenser in which the vapor may be condensed back to a liquid.

In particular, the vapor may be transported away from the semiconductor package via the center vacuum core region 139 of the heat pipe 130. The vapor may be cooled and condensed to liquid in the first upper heat pipe portion 130b-1 (e.g., in and/or near the heat sink 150). The condensed liquid may then be passively pumped from the condenser (e.g., first upper heat pipe portion 130b-1) back to the evaporator (e.g., lower heat pipe portion 130a) by a capillary action along the wick structure 138.

Figure 1D:
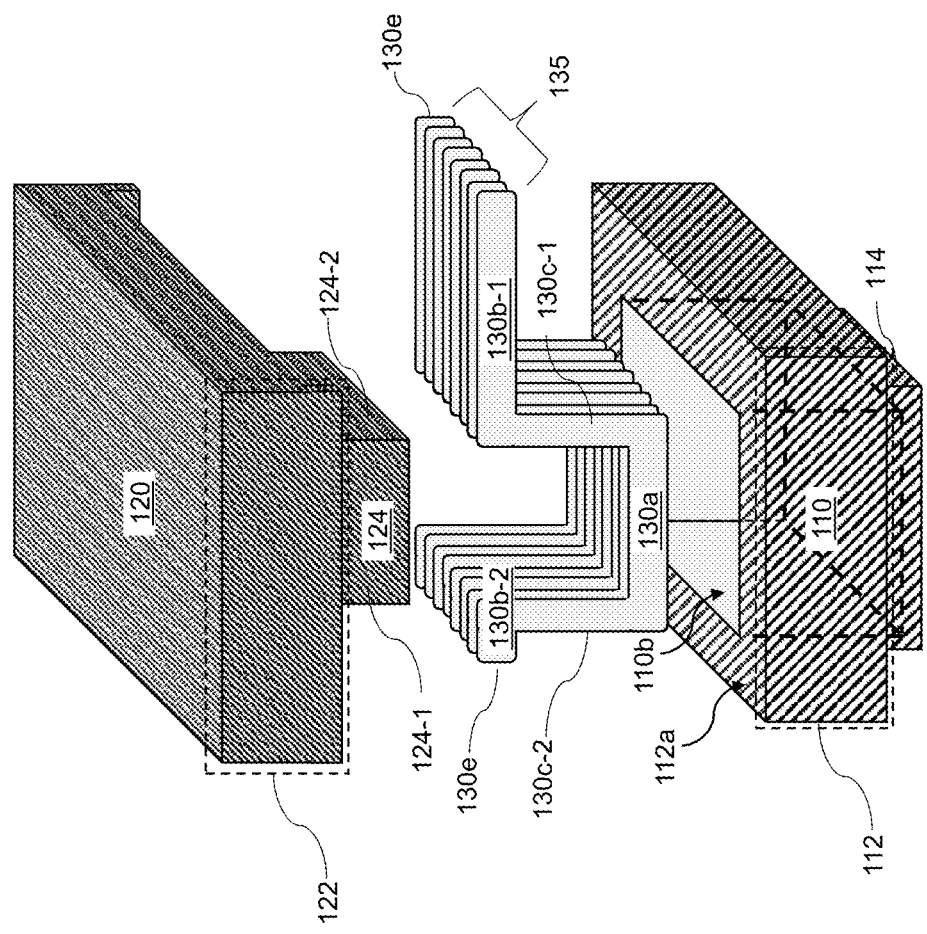
FIG. 1D is an exploded view of the thermal module according to one or more embodiments.

FIG. 1D is an exploded view of the thermal module 100 according to one or more embodiments. The heat sink 150 is not illustrated in FIG. 1D for ease of understanding. As illustrated in FIG. 1D, the heat pipe unit 135 may be substantially aligned with the cold plate base cavity 110b. In particular, the lower heat pipe portion 130a of the heat pipes 130 may be substantially aligned in the z-direction with the cold plate base cavity 110b. The lower heat pipe portion 130a may be seated on a bottom of the cold plate base cavity 110b and secured with the solder layer 140 (not shown). The first upper heat pipe portion 130b-1 and second upper heat pipe portion 130b-2 may be seated on the upper surface 112a of the cold plate base planar portion 112 and also secured with the solder layer 140.

Outer walls of the first side heat pipe portion 130c-1 and outer walls of the second side heat pipe portion 130c-2 may be substantially aligned in the z-direction with the sidewalls of the cold plate base cavity 110b. The cold plate cover protruding portion 124 may include a first face 124-1 that may be substantially aligned in the z-direction with a sidewall of the cold plate base cavity 110b, and a second face 124-2 that may be substantially aligned in the z-direction with an inner wall of the first side heat pipe portion 130c-1 and second side heat pipe portion 130c-2. At least part of a bottom of the cold plate cover planar portion 122 may be seated on an upper surface of the heat pipes 130. Another part of the bottom of the cold plate cover planar portion 122 may be seated on the upper surface 112a of the cold plate base planar portion 112.

In at least one embodiment, the cold plate base planar portion 122 may include a cut-out portion that accommodates the first upper heat pipe portion 130b-1 and second upper heat pipe portion 130b-2. In that case, an upper surface of the first upper heat pipe portion 130b-1 and second upper heat pipe portion 130b-2 may be substantially co-planar with the upper surface 112a of the cold plate base planar portion 112. With this design, the bottom of the cold plate cover planar portion 122 may be seated on the upper surface 112a of the cold plate base planar portion 112 around an entire perimeter of the cold plate base cavity 110b.

Figure 2A:
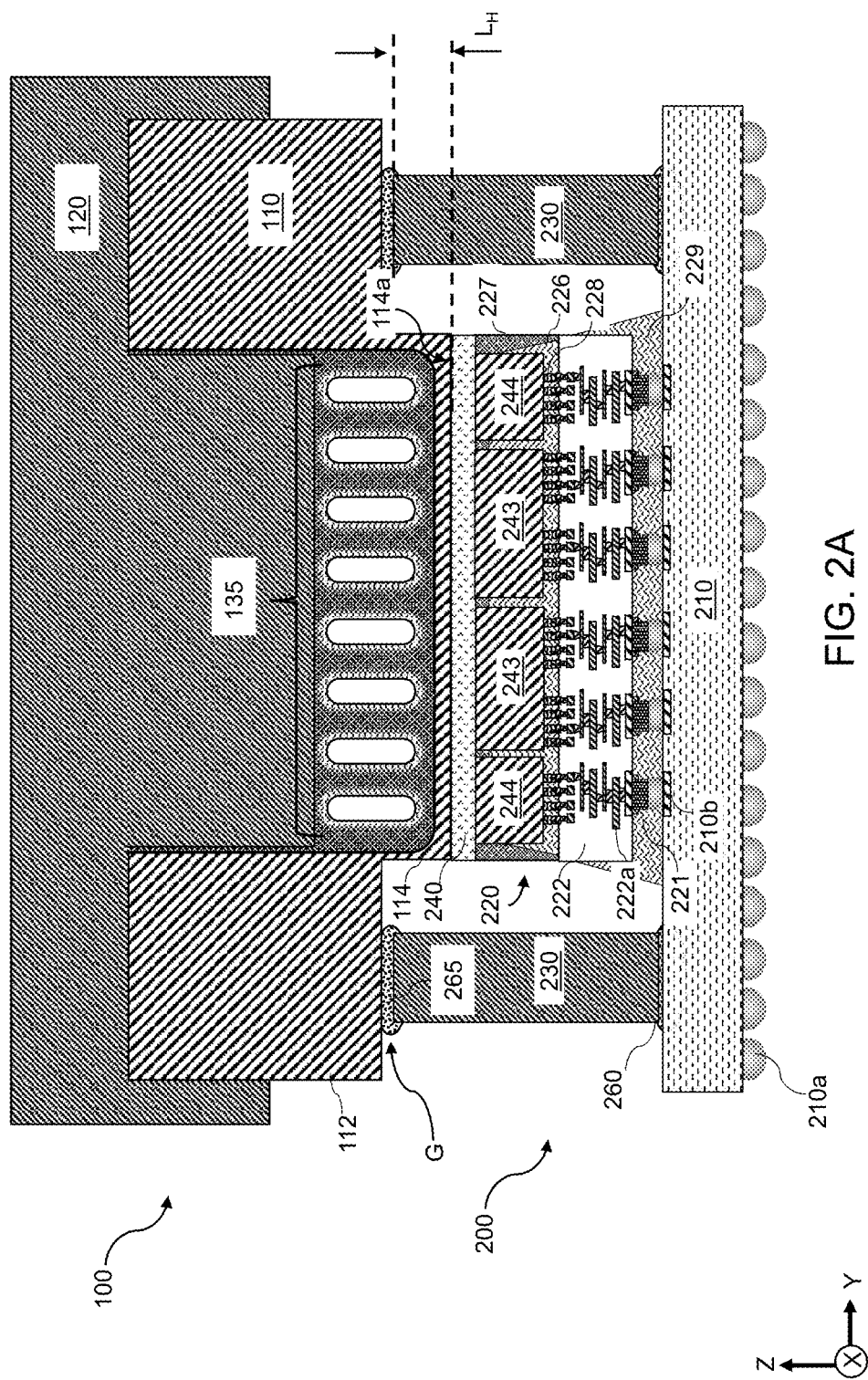
FIG. 2A is a vertical cross-sectional view of a semiconductor device including a semiconductor package with the thermal module mounted thereon, according to one or more embodiments.

FIG. 2A is a vertical cross-sectional view of a semiconductor device 20 including a semiconductor package 200 with the thermal module 100 mounted thereon, according to one or more embodiments. FIG. 2A is a vertical cross-sectional view along line AA' in FIG. 2B. The semiconductor package 200 may include, for example, a fan-out package having a high-performance computing (HPC) application. The semiconductor package 200 may include a package substrate 210, an interposer module 220 (e.g., CoW module) mounted on the package substrate 210 and a stiffener ring 230 mounted on the package substrate 210 around the interposer module 220. The semiconductor package 200 may also include a thermal interface material (TIM) film 240 on an upper surface of the interposer module 220.

The package substrate 210 may include a board-side surface and chip-side surface. The board-side surface of the package substrate 210 may include a ball grid array (BGA) including a plurality of solder balls 210a. The BGA may allow the semiconductor package 200 to be mounted on and electrically connected to an underlying substrate such as a printed circuit board (PCB). The chip-side surface of the package substrate 210 may include one or more conductive metal bonding pads 210b. The conductive metal bonding pads 210b may be electrically connected to the solder balls 210a of the BGA by various metal interconnect structures (e.g., metal vias and metal traces) within the package substrate 210.

The interposer module 220 may be mounted by C4 bumps 221 on the metal bonding pads 210b in the package substrate 210. The interposer module 220 may include an interposer dielectric 222 (e.g., organic or silicon interposer) that may include metal interconnects 222a connected to the C4 bumps 221. The interposer module 220 may also include one or more first semiconductor dies 243 and one or more second semiconductor dies 244 mounted on the interposer dielectric 222.

The first semiconductor dies 243 and second semiconductor dies 244 may be mounted on the interposer dielectric 222 by micro-bumps 228 that may be electrically connected to the metal interconnects 222a. A package underfill layer 229 may be formed under and around the interposer module 220 and the C4 bumps 221 so as to fix the interposer module 220 to the package substrate 210. The package underfill layer 229 may be formed of an epoxy-based polymeric material.

Each of the first semiconductor dies 243 and second semiconductor dies 244 may include, for example, a semiconductor die, a system on chip (SOC) die, a system on integrated chips (SoIC) die, and a high-bandwidth memory (HBM) die. In particular, the interposer module 220 may include, for example, an integrated graphics processing unit (GPU), application specific integrated circuit (ASIC), field-programmable gate array (FPGA), and HBM by chip on wafer on substrate (CoWoS) technology or integrated fan-out on substrate (INFO-oS) technology. In at least one embodiment, the first semiconductor devices 243 may include an SOC die and the second semiconductor devices 244 may include an HBM die or chiplet that is accessible by the SOC die.

An interposer underfill layer 226 may be formed around the micro-bumps 228 and between the first semiconductor dies 243 and the interposer dielectric 222, and between the second semiconductor dies 244 and the interposer dielectric 222. The interposer underfill layer 226 may be formed as separate portions under the first semiconductor dies 243 and second semiconductor dies 244. Alternatively, the interposer underfill layer 226 may be formed continuously under the first semiconductor dies 243 and second semiconductor dies 244. The interposer underfill layer 226 may also be formed between the first semiconductor dies 243 and the second semiconductor dies 244. The interposer underfill layer 226 may also be formed of an epoxy-based polymeric material.

A molding material layer 227 may be formed over the first semiconductor dies 243 and second semiconductor dies 244, the interposer underfill layer 226 and the interposer dielectric 222. The molding material layer 227 may be formed of an epoxy molding compound (EMC).

The TIM film 240 may be formed on the interposer module 220 to dissipate of heat generated during operation of the semiconductor package 200 (e.g., operation of first semiconductor dies 243 and second semiconductor dies 244). The TIM film 240 may be attached to the interposer module 220, for example, by a thermally conductive adhesive. In particular, the TIM film 240 may contact an upper surface of first semiconductor dies 243, an upper surface of second semiconductor dies 244 and an upper surface of the molding material layer 227. The TIM film 240 may have a low bulk thermal impedance and high thermal conductivity. The TIM film 240 may include, for example, a polymer, graphite, solder or silver powder material, although other materials may be used. A thickness of the TIM film 240 may be in a range of about 50 μm to about 200 μm, although greater or lesser distances may be used.

The semiconductor package 200 may also include a stiffener ring 230 that may be fixed to the package substrate 210 by an adhesive 260 (e.g., a silicone adhesive or an epoxy adhesive). The stiffener ring 230 may be formed of a metal such as copper with a nickel coating, or an aluminum alloy. The stiffener ring 230 may be formed on the package substrate 210 so as to encircle the interposer module 220. The stiffener ring 230 may provide rigidity to the package substrate 210.

The stiffener ring 230 may have a thickness in the z-direction in a range of about 1 mm to about 5 mm, although greater or lesser distances may be used. As illustrated in FIG. 2A, a height (in the z-direction) of an upper surface of the stiffener ring 230 may be greater than a height of an upper surface of the TIM film 240 by a distance $L_H$. In at least one embodiment, the height of the upper surface of the stiffener ring 230 may be at least 0.1 mm greater than the height of the upper surface of the TIM film 240.

As further illustrated in FIG. 2A, the thermal module 100 may be mounted on the semiconductor package 200 so that the contact surface 114a of the cold plate base protruding portion 114 contacts the upper surface of the TIM film 240. In at least one embodiment, the contact surface 114a of the cold plate base protruding portion 114 may contact substantially the entire upper surface of the TIM film 240. In particular, the cold plate base protruding portion 114 may protrude into a space between opposing inner sidewalls of the stiffener ring 230. A length of the cold plate base protruding portion 114 in the z-direction may be greater than the distance $L_H$, so that a gap G may be formed between the bottom surface of the cold plate base planar portion 112 and the upper surface of the stiffener ring 230. An adhesive 265 (e.g., a silicone adhesive or an epoxy adhesive) may be formed on the upper surface of the stiffener ring 230 in the gap G. The adhesive 265 may securely fix the bottom surface of the cold plate base planar portion 112 to the upper surface of the stiffener ring 230.

A width in the y-direction of the cold plate base protruding portion 114 may be substantially the same as a width of the interposer module 220 in the y-direction and substantially the same as a width of the TIM film 240 in the y-direction. The cold plate base planar portion 112 may extend laterally in the y-direction so as to be over the stiffener ring 230. In particular, a width of the cold plate base planar portion 112 may be greater than a distance between outer sidewalls of the stiffener ring 230. Thus, the cold plate base planar portion 112 may extend laterally beyond the outer sidewalls of the stiffener ring 230.

As further illustrated in FIG. 2A, the heat pipes 130 in the thermal module 100 may be located over the first semiconductor devices 243 and second semiconductor devices 244. In at least one embodiment, an area of the contact surface 114a may be equal to or greater than an area of the upper surface of the TIM film 240. In at least one embodiment, a width of the cold plate base cavity 110b in the y-direction may be substantially coextensive with a distance between outer sidewalls of the second semiconductor devices 244 in the y-direction. In at least one embodiment, a total length of the heat pipes 130 in the y-direction (including the spaces therebetween) may be substantially equal to or greater than the distance between outer sidewalls of the second semiconductor devices 244 in the y-direction.

Figure 2B:
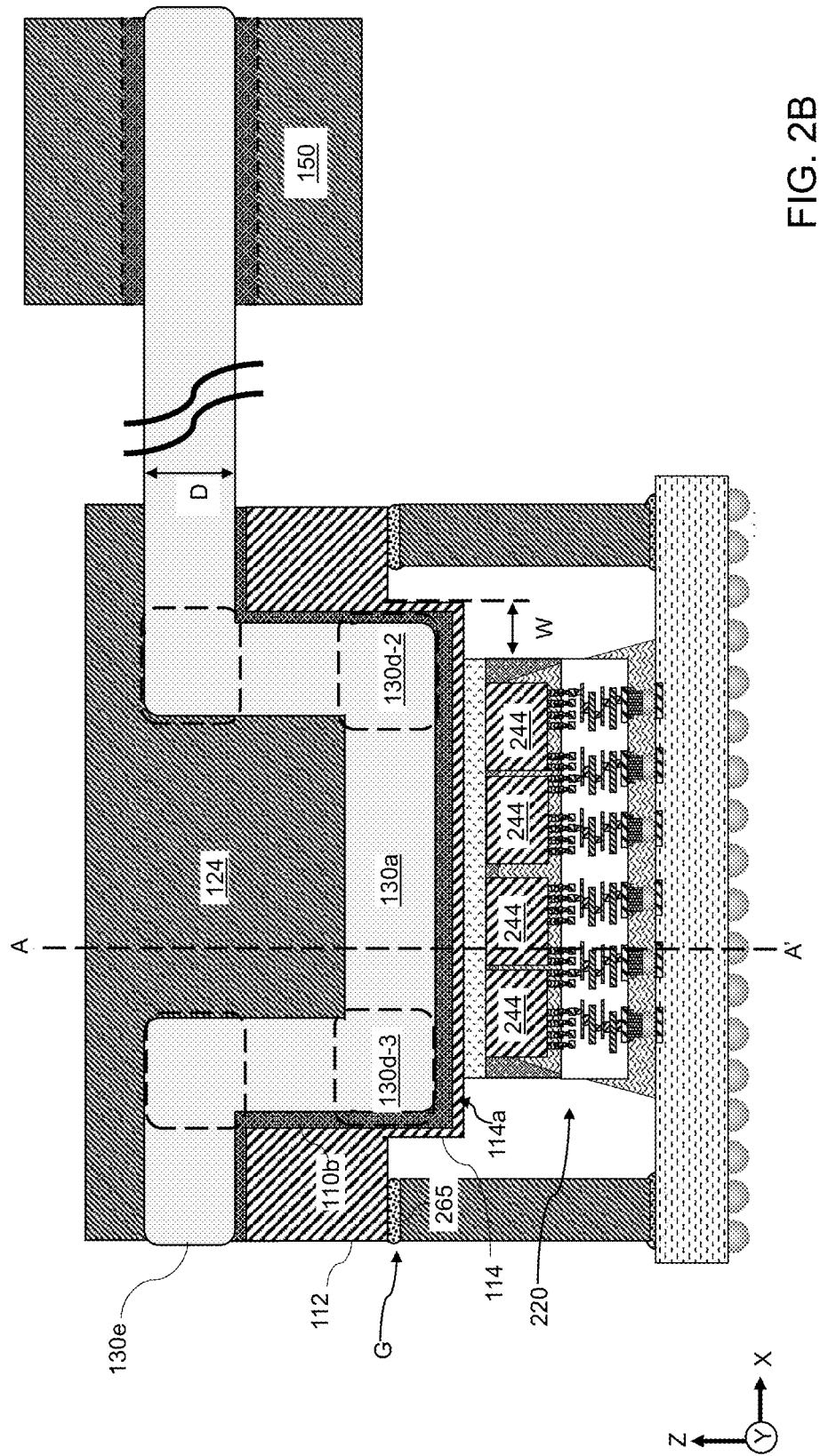
FIG. 2B is another vertical cross-sectional view of the semiconductor device according to one or more embodiments.

FIG. 2B is another vertical cross-sectional view of the semiconductor device 20 according to one or more embodiments. As illustrated in FIG. 2B, a width of the cold plate base protruding portion 114 in the x-direction may be greater than a width of the interposer module 220 in the x-direction and greater than a width of the TIM film 240 in the x-direction. In at least one embodiment a distance W between a sidewall of the interposer module 220 (e.g., a sidewall of the molding material layer 227) and a sidewall of the cold plate base protruding portion 114 may be greater than or equal to one half of a heat pipe diameter D of the heat pipe 130 (i.e., $W \geq D/2$).

A length of the heat pipe 130 in the x-direction in the cold plate base cavity 110b may be greater than the width of the interposer module 220 in the x-direction. In particular, a combined length in the x-direction of the lower heat pipe portion 130a, second bent heat pipe portion 130d-2 and third bend heat pipe portion 130d-3 may be greater than the width of the interposer module 220 in the x-direction.

The axis of the lower heat pipe portion 130a may be substantially parallel to the contact surface 114a of the cold plate base protruding portion 114. The axis of the lower heat pipe portion 130a may also be substantially parallel to the upper surface of the interposer module 220.

Further, the heat sink 150 may or may not be mounted on the same substrate as the semiconductor package 200. For example, the semiconductor package 200 and the heat sink 150 may or may not be mounted on the same PCB. In at least one embodiment, the semiconductor package 200 is mounted on a PCB and the heat sink 150 is mounted on a surface other than the PCB.

Figure 2C:
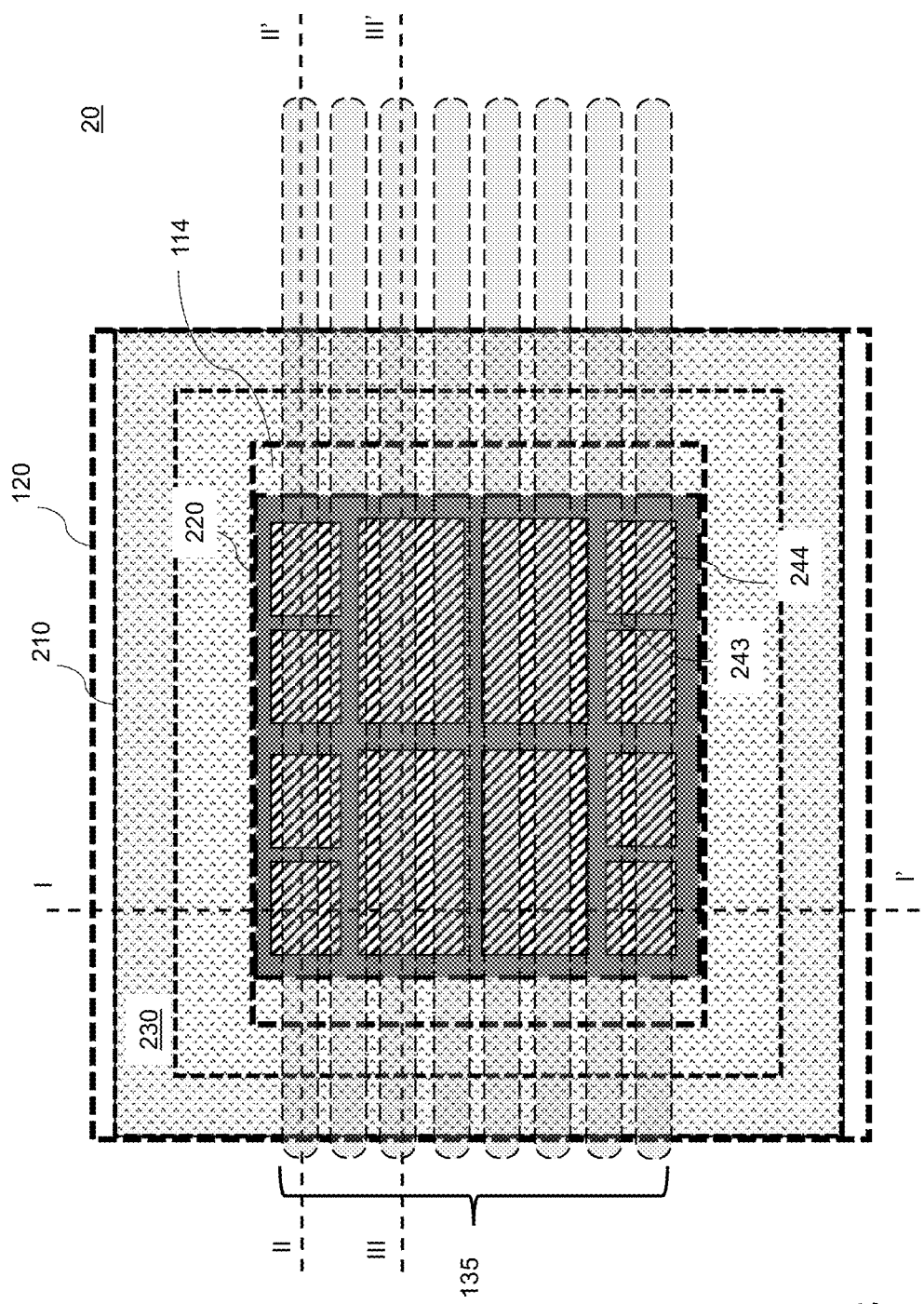
FIG. 2C is a plan view of the semiconductor device, according to one or more embodiments.

FIG. 2C is a plan view of the semiconductor device 20, according to one or more embodiments. The cross-sectional view of FIG. 2A may be taken along the cross-section I-I' in FIG. 2C, and the cross-sectional view of FIG. 2B may be taken along the cross-section II-II' in FIG. 2C.

In FIG. 2C, portions of the thermal module 100 may be omitted for ease of understanding. In addition, a location of the stiffener ring 230, the interposer module 220, the cold plate base protruding portion 114 and the heat pipes 130 may be indicated by dashed lines for ease of understanding.

As illustrated in FIG. 2C, in at least one embodiment, the stiffener ring 230 may be formed around an entire perimeter of the interposer module 220. The cold plate cover 120 may have a width in the x-direction that is substantially the same as an outer width of the stiffener ring 230 in the x-direction, and a width in the y-direction that is greater than an outer width of the stiffener ring 230 in the y-direction. In at least one embodiment, the cold plate base protruding portion 114 may be substantially centered over the interposer module 220. The cold plate base protruding portion 114 may further have a width in the y-direction that is substantially the same as a width of the interposer module 220 in the y-direction, and a width in the x-direction that is greater than a width of the interposer module 220 in the x-direction. As further illustrated in FIG. 2C, the heat pipes 130 may traverse the entire width of the package substrate 210 in the x-direction.

Figure 3:
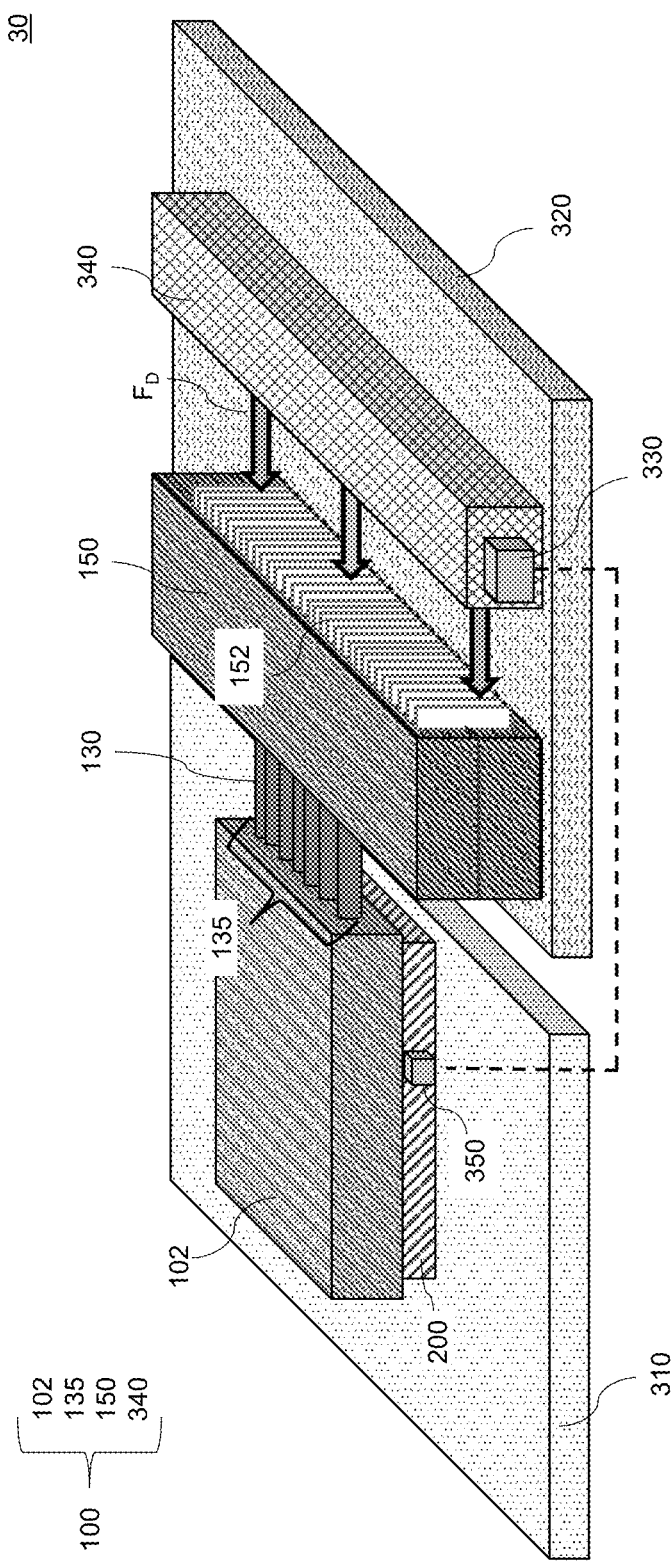
FIG. 3 is a perspective view that illustrates a semiconductor device including the thermal module according to one or more embodiments.

FIG. 3 illustrates a semiconductor device 30 including the thermal module 100 according to one or more embodiments. The semiconductor device 30 may include a first mounting substrate 310 and a semiconductor package 200 mounted on the first mounting substrate 310. The first mounting substrate 310 may include, for example, a PCB. Other electronic devices may be mounted on the first mounting substrate 310. The cold plate 102 of the thermal module 100 may be mounted on the semiconductor package 200 as illustrated, for example, in FIGS. 2A-2C.

The semiconductor device 30 may also include a second mounting substrate 320. The heat sink 150 of the thermal module 100 may be mounted on the second mounting substrate 320. The second mounting substrate 320 may also include a PCB, and other electronic devices may be mounted on the second mounting substrate 320. The heat pipes 130 of the heat pipe unit 135 may extend from the cold plate 102 to the heat sink 150. The heat pipes 130 may, therefore, extend between the first mounting substrate 310 and second mounting substrate 320. It should be noted that that a distance between the first mounting substrate 310 and the second mounting substrate 320 may be greater than the distance depicted in FIG. 3.

As illustrated in FIG. 3, the heat sink 150 may include a fin stack including a plurality of fins 152 (e.g., metal plates) that may help the heat sink 150 to dissipate heat. The semiconductor device 30 may also include a fan 340 mounted on the second mounting substrate 320. The fan 340 may be mounted adjacent to the heat sink 150. Although the fan 340 is depicted as separate from the heat sink 150 in FIG. 3, the fan 340 may be mounted on the heat sink 150. In at least one embodiment, the heat sink 150 and fan 340 may be integrally formed as a unit. The fan 340 may generate a delivery air stream F D onto the fins 152 in the heat sink 150 so as to cool the fins 152 and the thereby cool the portion of the heat pipes 130 fixed within the heat sink 150. The delivery air stream F D may thereby help to cool the heat pipes 130 and aid in the condensing of the vapor contained within the heat pipes 130.

Thus, in the embodiment of FIG. 3, the thermal module 100 may include the cold plate 102, the heat pipe unit 135 in the cold plate 102, the heat sink 150 and the fan 340. The thermal module 100 may serve as a heat exchanger for cooling the semiconductor package 200. The liquid (e.g., water) the heat pipes 130 may constitute a heat transfer fluid in the heat exchanger.

The fan 340 may include an electric fan that may be connected to an external power source. The fan 340 may include a variable speed fan. An operation of the fan 340 may be controlled, for example, by a control unit 330. The control unit 330 may be mounted on or near the fan 340. Alternatively, the control unit 330 may be located remotely from the fan 340 and connected to the fan 340 by a wired connection or wireless connection. The control unit 330 may include a processing device (e.g., processor, central processing unit (CPU)) for executing instructions to cause an operation to be performed by the fan 340. An operation of the fan 340 may include, for example, turning on the fan 340, turning off the fan 340, decreasing a speed of the fan 340 and increasing the speed of the fan 340.

Various sensors may be located on or near the semiconductor package 200 and/or thermal module 100 in order to monitor a condition of the semiconductor package 200. In particular, a thermal sensor 350 may be located on or near the semiconductor package 200, and may detect a temperature in, on or near the semiconductor package 200. In at least one embodiment, the thermal sensor 350 may be located on or near the heat sink 150 to detect a temperature of the heat sink 150 and/or a temperature of the heat pipes 130 in the heat sink 150.

The control unit 330 may be connected to the thermal sensor 350 by a wired connection or wireless connection. The control unit 330 may control an operation of the fan 340 based on a signal transmitted by the thermal sensor 350 to the control unit 330.

The control unit 330 may also include a memory device (random access memory (RAM), read only memory (ROM), etc.) for storing instructions to be executed by the processing device. The memory device may also store other data such as history data (e.g., temperature history data) collected by the thermal sensor 350 and/or other sensors on or near the semiconductor package 200 and/or thermal module 100. The processing device may access the data in the memory device and perform operations on the data, utilize the data in executing instructions, etc.

Figure 4A:
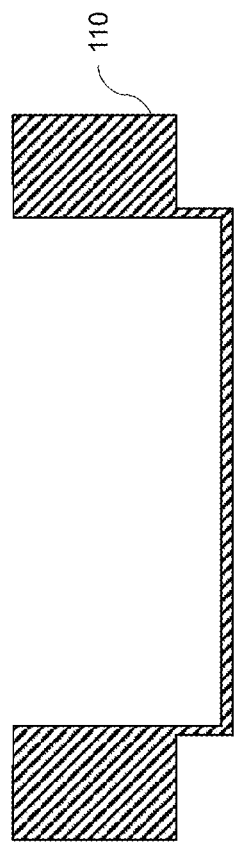
FIG. 4A illustrates an intermediate structure including a cold plate base, according to one or more embodiments.

FIGS. 4A-4F illustrate various intermediate structures in a method of forming a thermal module 100 according to one or more embodiments. In particular, FIG. 4A illustrates an intermediate structure including a cold plate base 110, according to one or more embodiments. The cold plate base 110 may be formed, for example, by milling a metal plate such as a copper plate or aluminum plate. In at least one embodiment, the cold plate base 110 may be formed, for example, by milling a metal plate using a computer numerical control (CNC) milling machine.

Figure 4B:
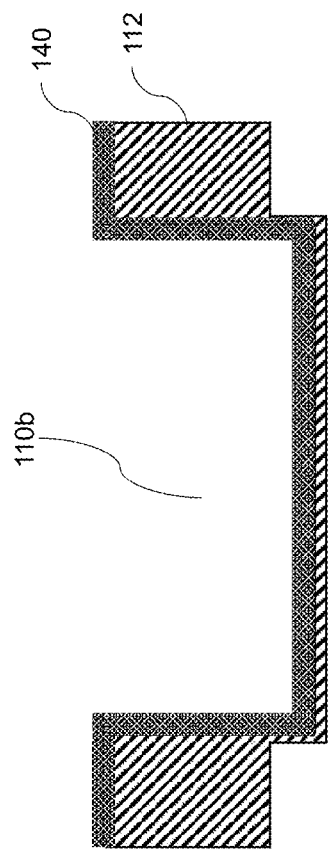
FIG. 4B illustrates an intermediate structure including a solder layer, according to one or more embodiments.

FIG. 4B illustrates an intermediate structure including a solder layer 140, according to one or more embodiments. The solder layer 140 may be composed, for example, of a solder material including one or more of tin, copper, silver, bismuth, indium, zinc, and antimony. In particular, the solder material may include a tin-silver-copper alloy including about 3-4% silver, 0.5-0.7% copper, and the balance (95%+) tin. The solder layer 140 may be formed by a plating process (e.g., electroplating process) or a reflowing process. The solder layer 140 may be conformally formed in the cold plate base cavity 110b and on the upper surface of the cold plate base planar portion 112. The solder layer 140 may be formed to have a substantially uniform thickness.

Figure 4C:
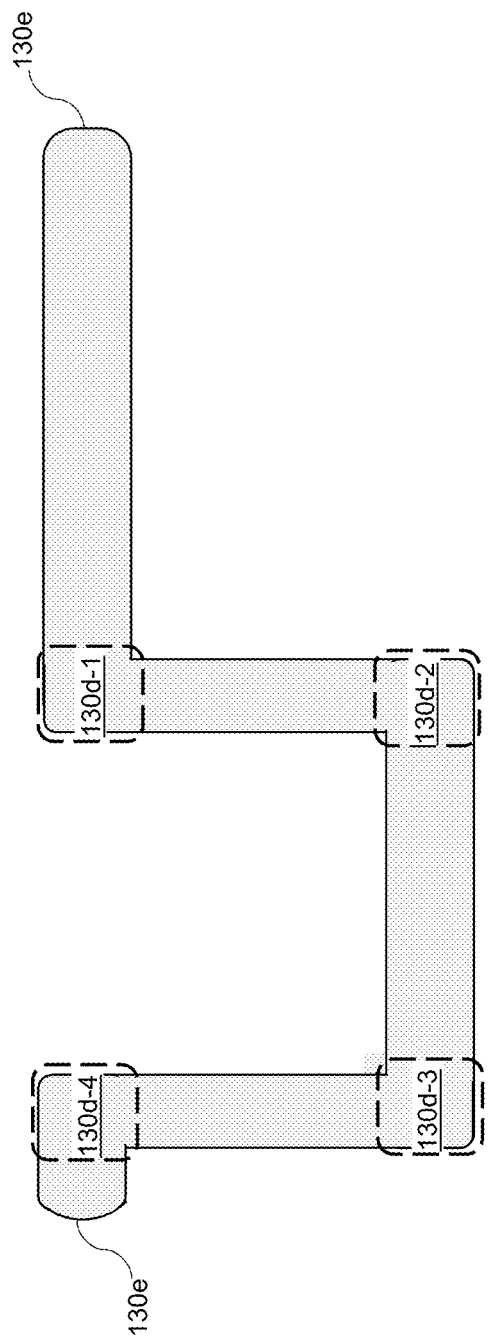
FIG. 4C illustrates an intermediate structure including the heat pipes, according to one or more embodiments.

FIG. 4C illustrates an intermediate structure including a heat pipe 130, according to one or more embodiments. In particular, FIG. 4C illustrates the forming of the heat pipe 130 so as to have a bent shape (e.g., a U-shape). The heat pipe 130 may be formed by bending a length of tubular heat pipe material (e.g., copper, copper alloy, aluminum, aluminum alloy, etc.) to form the bent heat pipe portions 130d-1, 130d-2, 130d-3 and 130d-4. The closed end portions 130e may be formed (e.g., by soldering) either before or after the forming of the bend heat pipe portions 130d-1, 130d-2, 130d-3 and 130d-4. A plurality of the heat pipes 130 may then be connected together (e.g., by soldering) in order to form the heat pipe unit 135.

FIG. 4D illustrates an intermediate structure including the heat pipes 130 on the cold plate base 110, according to one or more embodiments. Only one heat pipe 130 of the heat pipe unit 135 is shown in FIG. 4D for ease of understanding.

The heat pipes 130 may be lowered into cold plate base cavity 110b so that the lower heat pipe portion 130a is seated on the solder layer 140 at the bottom of the cold plate base cavity 110b. The first upper heat pipe portion 130b-1 and second upper heat pipe portion 130b-2 may also be seated on the solder layer 140 on the upper surface of the cold plate base planar portion 112. The intermediate structure may then heated to a softening temperature of the solder layer 140 while pressing (e.g., by a clamp) the heat pipes 130 onto the cold plate base 110.

FIG. 4E illustrates an intermediate structure including the cold plate cover 120 on the cold plate base 110, according to one or more embodiments. The cold plate cover protruding portion 124 may be inserted into the cold plate base cavity 110b seated on the lower heat pipe portion 130a. The cold plate cover 120 may then be fixed to the cold plate base 110 by one or more fastening members (not shown). In particular, one or more screw holes in the cold plate cover planar portion 122 may be aligned in the z-direction with one or more screw holes in the cold plate base cover portion 112, and screws inserted therein. The screws may be tightened so as to press the heat pipes 130 between the cold plate cover 120 and the cold plate base 110.

Figure 4F:
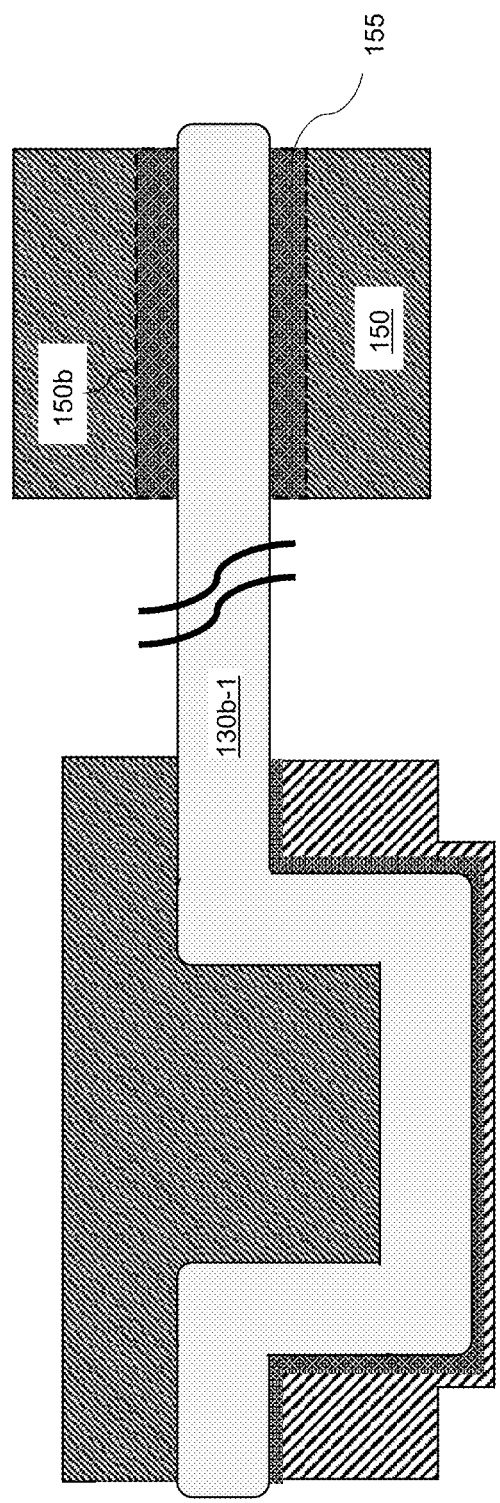
FIG. 4F illustrates an intermediate structure including the heat sink coupled to a distal portion, according to one or more embodiments.

FIG. 4F illustrates an intermediate structure including the heat sink 150, according to one or more embodiments. The first upper heat pipe portion 130b-1 may be inserted into a heat sink opening 150b in the heat sink 150. A solder layer 155 (e.g., a bead of solder material) may be applied to a surface of the first upper heat pipe portion 130b-1 in the heat sink opening 150b. The intermediate structure may then heated to a softening temperature of the solder layer 155 while the heat pipes 130 are held in the heat sink opening 150b. The intermediate structure may then be cooled so as to harden the solder layer 155 and fix the first upper heat pipe portion 130b-1 in the heat sink opening 150b.

Figure 5:
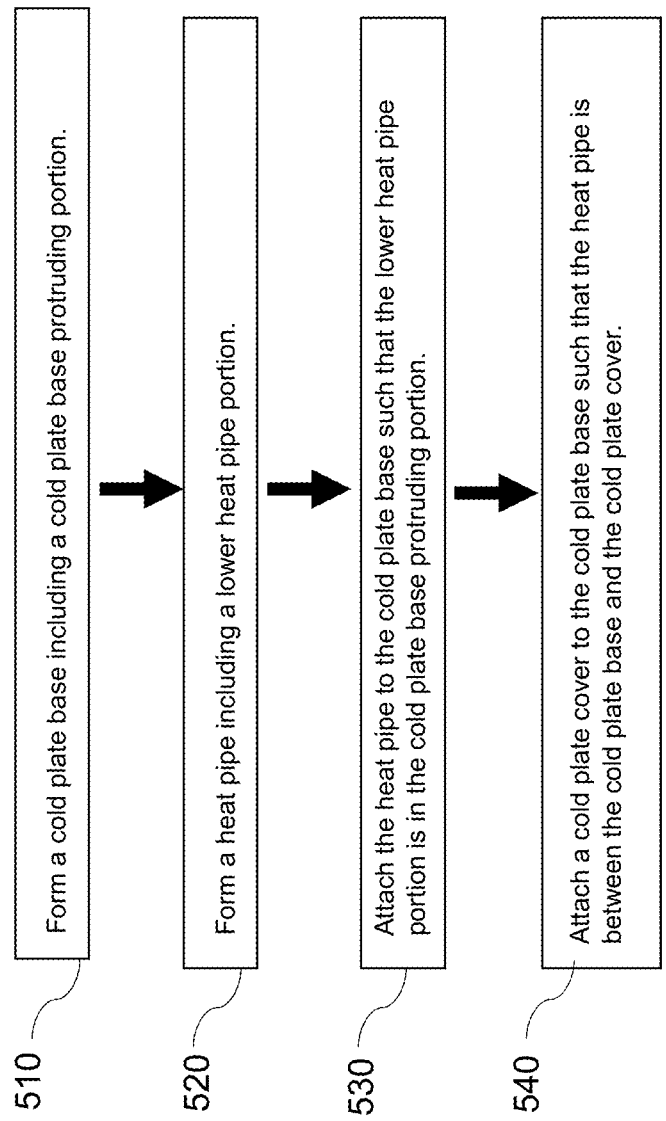
FIG. 5 is a flow chart illustrating a method of making a semiconductor package according to one or more embodiments.

FIG. 5 is a flow chart illustrating a method of making a semiconductor package according to one or more embodiments. Step 510 includes forming a cold plate base including a cold plate base protruding portion. Step 520 includes forming a heat pipe comprising a lower heat pipe portion. Step 530 include attaching the heat pipe to the cold plate base such that the lower heat pipe portion is in the cold plate base protruding portion. Step 540 includes attaching a cold plate cover to the cold plate base such that the heat pipe is between the cold plate base and the cold plate cover.

Figure 6:
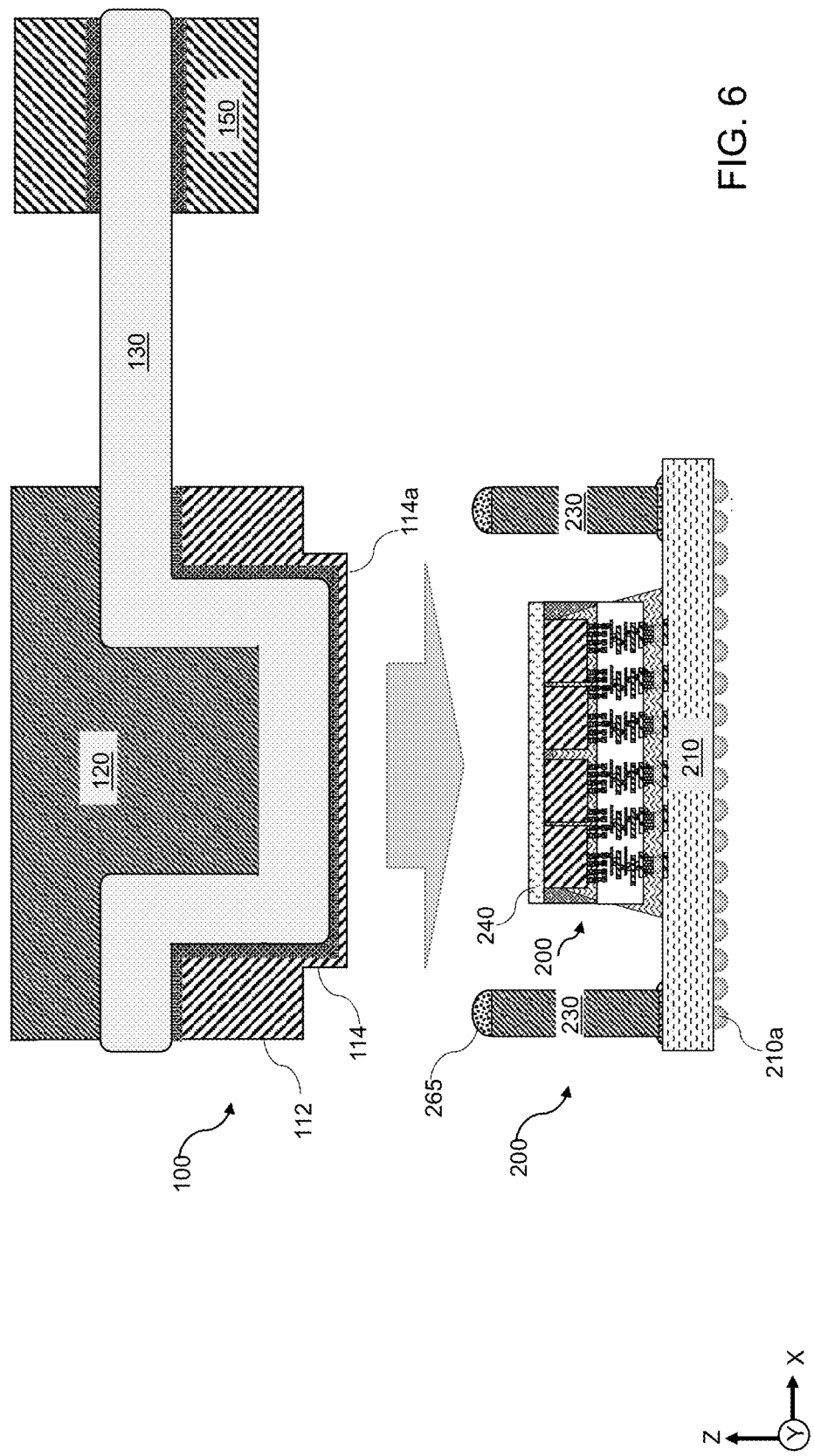
FIG. 6 is an intermediate structure formed in the method of forming a semiconductor device (e.g., see FIGS. 2A-2C) according to one or more embodiments.

FIG. 6 is an intermediate structure formed in the method of forming a semiconductor device 20 (e.g., see FIGS. 2A-2C) according to one or more embodiments. As illustrated in FIG. 6, a layer of adhesive 265 (e.g., a silicone adhesive or an epoxy adhesive) may be applied to the upper surface of the stiffener ring 230. The layer of adhesive 265 may be applied to only a portion of the upper surface of the stiffener ring 230, or to an entirety of the upper surface of the stiffener ring 230. The thermal module 100 may then be positioned over the semiconductor package 200 so that the cold plate base protruding portion 114 is substantially aligned with the interposer module 220. The cold plate base protruding portion 114 may then be inserted between the inner walls of the stiffener ring 230, so that the contact surface 114a of the cold plate base protruding portion 114 is seated on the TIM film 240. Pressure may then be applied to an upper surface of the cold plate cover 120 and to the bottom surface of the package substrate 210, and the adhesive 265 cured so as to fix the thermal module 100 to the semiconductor package 200.

As illustrated in FIG. 6, the thermal module 100 may be mounted on the semiconductor package 200 after the heat sink 150 is connected to the heat pipes 130 and after the solder balls 210a of the BGA are formed on the package substrate 210. Alternatively, the thermal module 100 may be mounted on the semiconductor package 200 before the heat sink 150 is connected to the heat pipes 130 and before the solder balls 210a of the BGA are formed on the package substrate 210.

FIGS. 7A-7C are various vertical cross-sectional views of an alternative design of the semiconductor device 20 according to one or more embodiments. In contrast to the design in FIGS. 2A-2B, in the alternative design illustrated in FIGS. 7A-7C, the protruding portion cavity 110b-1 may have a stepped configuration. The stepped configuration may include one or more steps in the bottom of the protruding portion cavity 110b-1. The cold plate cover protruding portion 124 may also have a stepped configuration that substantially corresponds to the stepped configuration of the protruding portion cavity 110b-1.

In particular, the stepped configuration may include a first cold plate base protruding portion cavity bottom $110b\text{-}1_{B1}$ and a second cold plate base protruding portion cavity bottom $110b\text{-}1_{B2}$. As illustrated in FIG. 7A, a depth H of the first cold plate base cavity bottom $110b\text{-}1_{B1}$ may be greater than a depth H' of the second cold plate base cavity bottom $110b\text{-}1_{B2}$. Thus, a thickness of the bottom of the cold plate base protruding portion 114 at the second cold plate base cavity bottom $110b\text{-}1_{B2}$ may be greater than a thickness of the bottom of the cold plate base protruding portion 114 at the first cold plate base cavity bottom $110b\text{-}1_{B1}$.

This alternative design recognizes that some areas of the interposer module 220 may have greater cooling requirements than other areas of the interposer module 220. The cooling requirements may depend, for example, on the type of semiconductor device located in the area. Thus, in the alternative design, the thickness of the bottom of the cold plate base protruding portion 114 may correspond to the cooling requirements of the interposer module 220. The first cold plate base cavity bottom 110b-1$_{B1}$ may be formed, for example, over a first area of the interposer module 220 having a high cooling requirement. The second cold plate base cavity bottom 110b-1$_{B2}$ may be formed, for example, over a second area of the interposer module 220 have a low cooling requirement (e.g., a cooling requirement lower than the cooling requirement of the first area).

As illustrated in FIG. 7A, the first cold plate base cavity bottom 110b-1$_{B1}$ may be located over the first semiconductor devices 243 (e.g., an SOC die) in the interposer module 220. The second cold plate base cavity bottom 110b-1$_{B2}$ may be located over the second semiconductor devices 244 (e.g., a HBM die or chiplet). This may allow the cold plate base 110 to have a higher rigidity over the second semiconductor devices 244 while providing for more effective cooling (e.g., higher power cooling) over the first semiconductor devices 243.

As further illustrated in FIG. 7A, the TIM film 240 in the alternative design may include a first TIM film portion 240a and a second TIM film portion 240b. The first TIM film portion 240a may be substantially aligned in the z-direction with the first cold plate base cavity bottom 110b-1$_{B1}$ and with the first semiconductor devices 243 (e.g., SOC dies). The second TIM film portion 240b may be substantially aligned with the second cold plate base cavity bottom 110b-1$_{B2}$ and with the second semiconductor devices 244 (e.g., HBM dies, chiplets, etc.). This alternative design may account for varying heat removal requirements of the first semiconductor devices 243 and the second semiconductor devices 244. For example, a heat transfer property of the first TIM film portion 240a may be different than a heat transfer property of the second TIM film portion 240b.

FIG. 7B is another vertical cross-sectional view of the alternative design of the semiconductor device 20 according to one or more embodiments. In particular, FIG. 7B is the view along the cross-section II-II' in FIG. 2C. As illustrated in FIG. 7B, the second cold plate base cavity bottom 110b-1$_{B2}$ having a depth H' may be formed over the area of the interposer module 220 including the second semiconductor devices 244. Thus, the bottom of the cold plate base protruding portion 114 in FIG. 7B may be relatively thick and provide a rigidity to the cold plate base protruding portion 114.

FIG. 7C is another vertical cross-sectional view of the alternative design of the semiconductor device 20 according to one or more embodiments. In particular, FIG. 7C is the view along the cross-section III-III' in FIG. 2C. As illustrated in FIG. 7C, the first cold plate base cavity bottom 110b-1$_{B1}$ having a depth H may be formed over the area of the interposer module 220 including the first semiconductor devices 243. Thus, the bottom of the cold plate base protruding portion 114 in FIG. 7C may be relatively thin so that a distance between the interposer module 220 and the lower heat pipe portion 130a in FIG. 7C, may be less than a distance between the interposer module 220 and the lower heat pipe portion 130a in FIG. 7B. Thus, a more effective cooling of the first semiconductor devices 243 may be provided by the first cold plate base cavity bottom 110b-1$_{B1}$.

Figure 8:
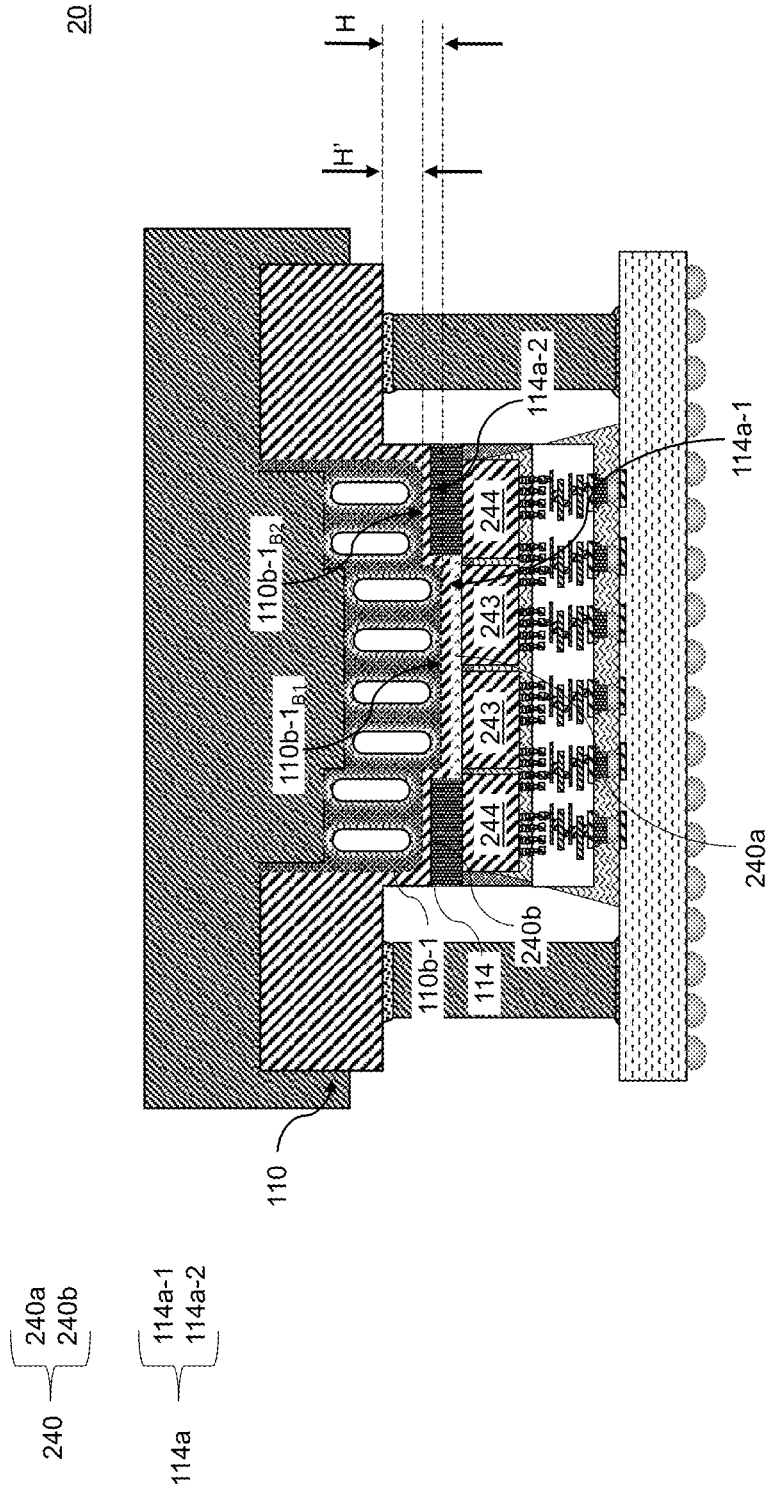
FIG. 8 is a vertical cross-sectional view of a second alternative design of the semiconductor device according to one or more embodiments.

FIG. 8 is a vertical cross-sectional view of a second alternative design of the semiconductor device 20 according to one or more embodiments. As illustrated in FIG. 8, in the second alternative design, the contact surface 114a of the cold plate base protruding portion 114 may have a stepped configuration. In particular, the stepped configuration of the contact surface 114a may substantially correspond to the stepped configuration of the bottom of the cold plate base protruding portion cavity 110b-1. That is, the contact surface 114a may include a first contact surface portion 114a-1 that may be substantially aligned in the z-direction with the first cold plate base protruding portion cavity bottom 110b-1B1, and a second contact surface portion 114a-2 that may be substantially aligned with the second cold plate base protruding portion cavity bottom 110b-1B2. The first contact surface portion 114a-1 may also be substantially aligned in the z-direction with the first TIM film portion 240a, and the second contact surface portion 114a-2 may also be substantially aligned with the second TIM film portion 240b.

In at least one embodiment, a difference between a height (in the z-direction) of the second contact surface portion 114a-2 and a height of the first contact surface portion 114a-1 may be substantially the same as a difference between the depth H of the first cold plate base cavity bottom 110b-1B1 and the depth H' of the second cold plate base cavity bottom 110b-1B2. Thus, the cold plate base protruding portion 114 at the first cold plate base protruding portion cavity bottom 110b-1B1 may have a thickness that is substantially the same as a thickness of the cold plate base protruding portion 114 at the second cold plate base protruding portion cavity bottom 110b-1B2.

However, in order to accommodate the stepped configuration of the contact surface 114, the TIM film 240 have a varied thickness. In particular, a thickness of the second TIM film portion 240b may be greater than a thickness of the first TIM film portion 240a. In at least one embodiment, a difference between the thickness of the second TIM film portion 240 and the thickness of the first TIM film portion 240a may be substantially the same as a difference between the depth H of the first cold plate base cavity bottom 110b-1B1 and the depth H' of the second cold plate base cavity bottom 110b-1B2.

That is, in the second alternative design, a size (e.g., length in the z-direction) of a gap to be filled between the second semiconductor devices 244 (e.g., HBM die or chiplets) and the second contact surface portion 114a-2 may be relatively large. Thus, the second TIM film portion 240b may include a thick thermal pad on the second semiconductor devices 244. On the other hand, a size of a gap to be filled between the first semiconductor devices 243 (e.g., SOC dies) and the first contact surface portion 114a-1 may be relatively small and the bond line thickness (BLT) can be well-controlled. Thus, the first TIM film portion 240a may include a grease, phase change or graphite TIM on the first semiconductor devices 243.

FIGS. 9A-9C are various views of an alternative heat pipe design according to one or more embodiments. In particular, FIG. 9A is a perspective view of the alternative heat pipe design according to one or more embodiments. As illustrated in FIG. 9A, in the alternative heat pipe design, the heat pipe 130 may include a delivery heat pipe section 130-1 that delivers cooled liquid (e.g., water) toward the semiconductor package for cooling, and a return heat pipe section 130-2 that returns evaporated liquid (e.g., water vapor) to the heat sink 150 (not shown) to be condensed back into liquid.

The alternative heat pipe design may be used, for example, in the heat pipe unit 135 described above (e.g., see FIGS. 1A and 1B). In particular, the heat pipe unit including heat pipes 130 with the alternative heat pipe design may also interface with the cold plate 102 and heat sink 150 as described above (e.g., see FIGS. 1D and 3).

As illustrated in FIG. 9A, the delivery heat pipe section 130-1 may include an upper heat pipe portion 130-1b, a side heat pipe portion 130-1c, and a lower heat pipe portion 130-1a. The delivery heat pipe section 130-1 may also include a connecting portion 130-1e that connects the delivery heat pipe section 130-1 to the return heat pipe section 130-2.

FIG. 9B is a cross-sectional view of the delivery heat pipe section 130-1 according to one or more embodiments. As illustrated in FIG. 9B, the delivery heat pipe section 130-1 may have a design that is substantially the same as the design in FIG. 1C. However, the delivery heat pipe section 130-1 includes a thicker wick structure 138a having a greater thickness than the wick structure 138, which may improve the rate of liquid transport. The delivery heat pipe section 130-1 may also include a narrow center vacuum core region 139 that may reduce an amount of vapor therein. With this design, there may be a reduced amount of vapor in the delivery heat pipe section 130-1 compared to the heat pipe 130 in FIG. 1C. Therefore, there will be a reduced heating of the liquid delivered in the wick structure 138 so that the liquid delivered to the lower heat pipe portion 130-1a may have a lower temperature than the heat pipe 130 in FIG. 1C.

As further illustrated in FIG. 9A, the return heat pipe section 130-2 may include an upper heat pipe portion 130-2b, a side heat pipe portion 130-2c, and a connecting portion 130-2e connecting the side heat pipe portion 130-2c to the upper heat pipe portion 130-2b. The liquid in the heat pipe 130 that is evaporated in the lower heat pipe portion 130a and the resulting vapor is returned to the heat sink 150 (not shown) via the return heat pipe section 130-2. In particular, the vapor enters the side heat pipe portion 130-2c, then the connecting portion 130-2e, and then the upper heat pipe portion 130-2b where it is cooled by the heat sink 150. FIG. 9C is a cross-sectional view of the return heat pipe section 130-2 according to one or more embodiments. As illustrated in FIG. 9C, the return heat pipe section 130-2 may not include a wick structure 138, which allows for a large diameter center vacuum core region 139b. The enlarged center vacuum core region 139b may promote the flow of vapor in the return heat pipe section 130-2 and away from the delivery heat pipe section 130-1.

The alternative design may, therefore, transport the vapor in the return heat pipe section 130-2 separately from the liquid in the delivery heat pipe section 130-1. This may allow the alternative design to provide more effective cooling of the semiconductor package.

Referring to all drawings and according to various embodiments of the present disclosure, a thermal module 100 may include a cold plate 102 including a cold plate base 110 including a cold plate base protruding portion 114, and a cold plate cover 120 on the cold plate base 110, and a heat pipe 130 between the cold plate base 110 and the cold plate cover 120, including an upper heat pipe portion 130b and a lower heat pipe portion 130a in the cold plate base protruding portion 114.

In an embodiment, the cold plate base 110 may further include a cold plate base cavity 110b and the lower heat pipe portion 130a may be located on a bottom of the cold plate base cavity 110b. In an embodiment, the thermal module 100 may further include a solder layer on the bottom of the cold plate base cavity 110b and on a sidewall of the cold plate base cavity 110b for fixing the heat pipe 130 in the cold plate base cavity 110b. In an embodiment, a shape of the heat pipe 130 may substantially conform to a shape of the cold plate base cavity 110b. In an embodiment, the cold plate cover 120 may include a cold plate cover protruding portion 124 located on the lower heat pipe portion 130a and in the cold plate base cavity 110b. In an embodiment, the cold plate base 110 may further include a cold plate base planar portion 112 and the cold plate base protruding portion 114 may protrude from the cold plate base planar portion 112. In an embodiment, the cold plate base cavity 110b may include a cold plate base protruding portion cavity 110b-1 in the cold plate base protruding portion 114, and a cold plate base planar portion cavity 110b-2 in the cold plate base planar portion 112. In an embodiment, a ratio (H/P) of the depth (H) of the cold plate base protruding portion cavity 110b-1 to a length of the cold plate base protruding portion 114 may be less than or equal to 0.5. In an embodiment, the cold plate base protruding portion cavity 110b-1 may include a plurality of depths and a shape of the heat pipe 130 may substantially conform to the plurality of depths of the cold plate base protruding portion cavity 110b-1. In an embodiment, the heat pipe 130 may further include a heat pipe bent portion 130d connected to the lower heat pipe portion 130a, and a side heat pipe portion 130c-1, 130c-2 connected to the heat pipe bent portion 130d, wherein an axis of the side heat pipe portion 130c-1, 130c-2 may be substantially perpendicular to an axis of the lower heat pipe portion 130a. In an embodiment, the heat pipe 130 may further include the upper heat pipe portion 130b-1, 130b-2 may be located outside the cold plate base cavity 110b. A heat pipe bending length L between the upper heat pipe portion 130b-1, 130b-2 and the lower heat pipe portion 130a may be greater than or equal to one half of a heat pipe diameter D of the heat pipe 130. In an embodiment, the thermal module 100 may further include a heat sink 150 connected to the upper heat pipe portion 130b-1 for cooling a heat exchange fluid in the upper heat pipe portion 130b-1.

According to another aspect of the present disclosure, a method of forming a thermal module 100 may include forming a cold plate base 110 including a cold plate base protruding portion 114, forming a heat pipe 130 including an upper heat pipe portion 130b and a lower heat pipe portion 130a, attaching the heat pipe 130 to the cold plate base 110 such that the lower heat pipe portion 130a may be in the cold plate base protruding portion 114, and attaching a cold plate cover 120 to the cold plate base 110 such that the heat pipe 130 may be between the cold plate base 110 and the cold plate cover 120.

In an embodiment, the forming of the cold plate base 110 may include forming a cold plate base cavity 110b in the cold plate base 110, and the attaching of the heat pipe 130 to the cold plate base 110 may include attaching the lower heat pipe portion 130a to a bottom of the cold plate base cavity 110b. In an embodiment, the method may further include forming a solder layer on the bottom of the cold plate base cavity 110b and on a sidewall of the cold plate base cavity 110b, and the attaching of the heat pipe 130 to the cold plate base 110 may include fixing the heat pipe 130 in the cold plate base cavity 110b by the solder layer. The method may further include attaching the heat pipe 130 to a heat sink 150.

According to another aspect of the present disclosure, a semiconductor device 20, 30 may include a semiconductor package including an interposer module on a package substrate, and a stiffener ring on the package substrate and around the interposer module, a thermal module 100 including a cold plate mounted on the interposer module and the stiffener ring, the cold plate including a cold plate base 110 having a cold plate base protruding portion 114, and a cold plate cover 120 on the cold plate base 110, and a heat pipe 130 between the cold plate base 110 and the cold plate cover 120, including an upper heat pipe portion 130b and a lower heat pipe portion 130a in the cold plate base protruding portion 114. The cold plate base 110 may further a cold plate base cavity 110b and the lower heat pipe portion 130a may be located on a bottom of the cold plate base cavity 110b. A width of the cold plate base protruding portion 114 may be greater than a width of the interposer module. A distance between a sidewall of the interposer module and a sidewall of the cold plate base protruding portion 114 may be greater than or equal to one half of a heat pipe diameter D of the heat pipe 130. The semiconductor device 20, 30 may further include a thermal interface material (TIM) film 240, and the cold plate base protruding portion 114 may protrude inside the stiffener ring 230 and may be seated on the TIM film 240.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A thermal module, comprising:
a cold plate comprising:
a cold plate base including a cold plate base protruding portion and a cold plate base cavity in the cold plate base protruding portion; and
a cold plate cover covering the cold plate base, wherein the cold plate cover comprises a cold plate cover protruding portion protruding into the cold plate base cavity and including a sidewall facing a sidewall of the cold plate base cavity; and
a heat pipe between the cold plate base and the cold plate cover, comprising an upper heat pipe portion and a lower heat pipe portion in the cold plate base protruding portion.

2. The thermal module of claim 1, wherein the lower heat pipe portion is located on a bottom of the cold plate base cavity.

3. The thermal module of claim 2, further comprising:
a solder layer on the bottom of the cold plate base cavity and on the sidewall of the cold plate base cavity for fixing the heat pipe in the cold plate base cavity.

4. The thermal module of claim 2, wherein a shape of the heat pipe substantially conforms to a shape of the cold plate base cavity.

5. The thermal module of claim 2, wherein a bottom surface of the cold plate cover protruding portion contacts an upper surface of the lower heat pipe portion.

6. The thermal module of claim 2, wherein the cold plate base further comprises a cold plate base planar portion and the cold plate base protruding portion protrudes from the cold plate base planar portion, and the cold plate base cavity comprises:
a cold plate base protruding portion cavity in the cold plate base protruding portion; and
a cold plate base planar portion cavity in the cold plate base planar portion.

7. The thermal module of claim 6, wherein a ratio (H/P) of the depth (H) of the cold plate base protruding portion cavity to a length of the cold plate base protruding portion is less than or equal to 0.5.

8. The thermal module of claim 6, wherein the cold plate base protruding portion cavity comprises a plurality of depths and a shape of the heat pipe substantially conforms to the plurality of depths of the cold plate base protruding portion cavity.

9. The thermal module of claim 1, wherein the heat pipe further comprises:
a heat pipe bent portion connected to the lower heat pipe portion; and
a side heat pipe portion connected to the heat pipe bent portion, wherein an axis of the side heat pipe portion is substantially perpendicular to an axis of the lower heat pipe portion.

10. The thermal module of claim 9, wherein the upper heat pipe portion is located outside of the cold plate base cavity and wherein a heat pipe bending length between the upper heat pipe portion and the lower heat pipe portion is greater than or equal to one half of a heat pipe diameter of the heat pipe.

11. The thermal module of claim 10, further comprising a heat sink thermally coupled to the upper heat pipe portion for cooling a heat exchange fluid in the upper heat pipe portion.

12. A thermal module, comprising:
a cold plate base including a cold plate base protruding portion and a cold plate base cavity in the cold plate base protruding portion;
a heat pipe in the cold plate base cavity; and
a cold plate cover on the heat pipe and covering the cold plate base, wherein the cold plate cover comprises a cold plate cover protruding portion having a shape substantially conforming to a shape of the heat pipe, protruding into the cold plate base cavity and including a sidewall facing a sidewall of the cold plate base cavity.

13. The thermal module of claim 12, wherein the cold plate base further comprises a cold plate base planar portion, the cold plate base protruding portion protrudes from the cold plate base planar portion and the heat pipe comprises a pair of upper heat pipe portions on the cold plate base planar portion.

14. The thermal module of claim 13, wherein the heat pipe further comprises a pair of side heat pipe portions connected to the pair of upper heat pipe portions and located on opposing sides of the cold plate base cavity, and the cold plate cover protruding portion is located between the pair of side heat pipe portions.

15. The thermal module of claim 14, wherein the heat pipe further comprises:
a lower heat pipe portion located on a bottom of the cold plate base cavity; and
a pair of bent heat pipe portions located on the bottom of the cold plate base cavity and connecting the pair of side heat pipe portions to opposing ends of the lower heat pipe portion.

16. The thermal module of claim 12, wherein the cold plate base cavity comprises a first cold plate base cavity bottom having a first depth and a second cold plate base cavity bottom having a second depth greater than the first depth.

17. The thermal module of claim 16, wherein the first cold plate base cavity bottom is located at an outer region of the cold plate base cavity and the second cold plate base cavity bottom is located at an inner region of the cold plate base cavity.

18. The thermal module of claim 16, wherein a shape of the heat pipe substantially conforms to a shape of the first cold plate base cavity bottom and a shape of the second cold plate base cavity bottom.

19. A thermal module, comprising:
- a cold plate base including a cold plate base protruding portion and a cold plate base cavity in the cold plate base protruding portion;
- a cold plate cover covering the cold plate base and comprising a cold plate cover protruding portion protruding into the cold plate base cavity and having a sidewall facing a sidewall of the cold plate base cavity;
- a heat pipe located on a bottom of the cold plate base cavity and including a heat exchange fluid; and
- a solder layer on the bottom of the cold plate base cavity and connecting the heat pipe to the bottom of the cold plate base cavity.

20. The thermal module of claim 19, further comprising:
- a heat sink thermally coupled to the heat pipe and configured to cool the heat exchange fluid in the heat pipe, wherein the heat pipe further comprises:
  - a heat pipe wall;
  - a wick structure on an inner surface of the heat pipe wall and configured to transport the heat exchange fluid as a liquid from the heat sink into the cold plate base cavity; and
  - a core portion adjacent the wick structure and configured to transport the heat exchange fluid as a vapor from the cold plate base cavity to the heat sink.

* * * * *